(12) United States Patent
Liu et al.

(10) Patent No.: US 9,082,852 B1
(45) Date of Patent: Jul. 14, 2015

(54) LDMOS FINFET DEVICE USING A LONG CHANNEL REGION AND METHOD OF MANUFACTURE

(71) Applicants: STMicroelectronics, Inc., Coppell, TX (US); International Business Machines Corporation, Armonk, NY (US); GlobalFoundries Inc, Grand Cayman (KY)

(72) Inventors: Qing Liu, Watervliet, NY (US); Ruilong Xie, Schenectady, NY (US); Xiuyu Cai, Niskayuna, NY (US); Chun-Chen Yeh, Clifton Park, NY (US)

(73) Assignees: STMicroelectronics, Inc., Coppell, TX (US); GlobalFoundries Inc., Grand Cayman (KY); International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/560,472

(22) Filed: Dec. 4, 2014

(51) Int. Cl.
*H01L 29/78* (2006.01)

(52) U.S. Cl.
CPC .................................. *H01L 29/785* (2013.01)

(58) Field of Classification Search
CPC ........................ H01L 29/7855; H01L 29/7856
See application file for complete search history.

(56) References Cited

U.S. PATENT DOCUMENTS

| 8,796,759 | B2 * | 8/2014 | Perng et al. | 257/328 |
|---|---|---|---|---|
| 2006/0289948 | A1 | 12/2006 | Brown et al. | |
| 2013/0062692 | A1 | 3/2013 | Chen et al. | |
| 2013/0299922 | A1 | 11/2013 | Choi et al. | |
| 2014/0117453 | A1 * | 5/2014 | Lu | 257/365 |
| 2014/0220752 | A1 * | 8/2014 | Park et al. | 438/283 |

\* cited by examiner

*Primary Examiner* — Jerome Jackson, Jr.
*Assistant Examiner* — Steven B Gauthier
(74) *Attorney, Agent, or Firm* — Gardere Wynne Sewell LLP

(57) ABSTRACT

A FinFET includes a semiconductor fin supporting a first transistor and a second transistor. A first transistor gate electrode extends over a first channel region of the fin and a second transistor gate electrode extends over a second channel region of the fin. Epitaxial growth material on a top of the fin forms a raised source region on a first side of the first transistor gate electrode, an intermediate region between a second side of the first transistor gate electrode and a first side of the second transistor gate electrode, and a raised drain region on a second side of the second transistor gate electrode. The first and second transistor gate electrodes are short circuit connected to each other, with the first transistor configured to have a first threshold voltage and the second transistor configured to have a second threshold voltage different from the first threshold voltage.

30 Claims, 24 Drawing Sheets

US 9,082,852 B1

LDMOS FINFET DEVICE USING A LONG CHANNEL REGION AND METHOD OF MANUFACTURE

TECHNICAL FIELD

The present invention relates to the fabrication of integrated circuits and, more particularly, to a process for the formation of FinFET-type integrated circuit devices and a device produced by such a process.

BACKGROUND

A FinFET transistor utilizes a channel region which is oriented to conduct an electrical current parallel to the surface of the substrate. The channel region is provided in an elongated section of semiconductor material referred to in the art as a "fin." The source and drain regions of the transistor are typically also formed in the elongated section on either side of the channel region. A gate is placed over and on both opposed sides of the elongated section at the location of the channel region to provide control over the conductive state of the transistor. This FinFET design is well suited for manufacturing a multi-channel transistor in which multiple elongated sections are formed in parallel to define neighboring channel regions separated from each other by an intermediate gate portion, where the transistor gate spans with a perpendicular orientation over the multiple elongated sections.

The prior art recognizes the advantages which accrue from the use of FinFET-type transistors. The prior art further recognizes the advantages which accrue from the use of transistors of the laterally diffused metal oxide semiconductor (LDMOS) type which have a highly resistive drain region to support high power and radio frequency (RF) applications. However, it has proven to be quite a challenge to provide an LDMOS which is compatible with FinFET devices. There is a need in the art for the integration of an LDMOS into a FinFET transistor.

SUMMARY

In an embodiment, an integrated FinFET transistor circuit comprises: a fin of semiconductor material supporting a first transistor and a second transistor; a first transistor gate electrode extending over a first channel region of said fin; a second transistor gate electrode extending over a second channel region of said fin; a raised source region of epitaxial growth material extending from a top of said fin on a first side of the first transistor gate electrode; a raised intermediate region of said epitaxial growth material extending from a top of said fin between a second side of the first transistor gate electrode and a first side of the second transistor gate electrode; a raised drain region of said epitaxial growth material extending from a top of said fin on a second side of the second transistor gate electrode; wherein the first and second transistor gate electrodes are short circuit connected to each other; and wherein said first transistor is configured to have a first threshold voltage and said second transistor is configured to have a second threshold voltage that is different than the first threshold voltage.

In an embodiment, a method for manufacturing a FinFET transistor, comprises: forming a fin of semiconductor material; forming a first transistor gate structure for a first transistor that extends over a first channel region of said fin; forming a second transistor gate structure for a second transistor that extends over a second channel region of said fin; epitaxially growing epitaxial growth material on a top of said fin on a first side of the first transistor gate structure to form a raised source region, between a second of the first transistor gate structure and a first side of the second transistor gate structure to form a raised intermediate region, and on a second side of the second transistor gate structure to form a raised drain region; short circuit connecting the first and second transistor gate structures to each other; and configuring said first transistor to have a first threshold voltage and said second transistor to have a second threshold voltage that is different than the first threshold voltage.

In an embodiment, an integrated circuit comprises: a substrate; a first FinFET transistor supported by said substrate and including a first fin of semiconductor material; and a second FinFET transistor support by said substrate and including a second fin of semiconductor material. The first FinFET transistor comprises: a first transistor gate electrode extending over a first channel region of said first fin; a first raised source region of epitaxial growth material extending from a top of said first fin on a first side of the first transistor gate electrode; and a raised drain region of said epitaxial growth material extending from a top of said first fin on a second side of the first transistor gate electrode. The second FinFET transistor comprises: a main transistor gate electrode extending over a first channel region of said second fin; an auxiliary transistor gate electrode extending over a second channel region of said second fin; a raised source region of said epitaxial growth material extending from a top of said fin on a first side of the main transistor gate electrode; a raised intermediate region of said epitaxial growth material extending from a top of said fin between a second side of the main transistor gate electrode and a first side of the auxiliary transistor gate electrode; and a raised drain region of said epitaxial growth material extending from a top of said fin on a second side of the auxiliary transistor gate electrode; wherein the main and auxiliary transistor gate electrodes are short circuit connected to each other; and wherein said main transistor is configured to have a first threshold voltage and said auxiliary transistor is configured to have a second threshold voltage that is different than the first threshold voltage.

BRIEF DESCRIPTION OF THE DRAWINGS

For a better understanding of the embodiments, reference will now be made by way of example only to the accompanying figures in which:

FIGS. 1-15B show process steps for the formation of one FinFET device having a laterally diffused metal oxide semiconductor (LDMOS) configuration; and FIGS. 1-7B and 16A-24B show process steps for the formation of another FinFET device having a laterally diffused metal oxide semiconductor (LDMOS) configuration.

DETAILED DESCRIPTION OF THE DRAWINGS

Reference is now made to FIGS. 1-15B showing process steps for the formation of a FinFET device having a laterally diffused metal oxide semiconductor (LDMOS) configuration. It will be understood that the illustrations provided do not necessarily show the features drawn to scale.

Figure 1:
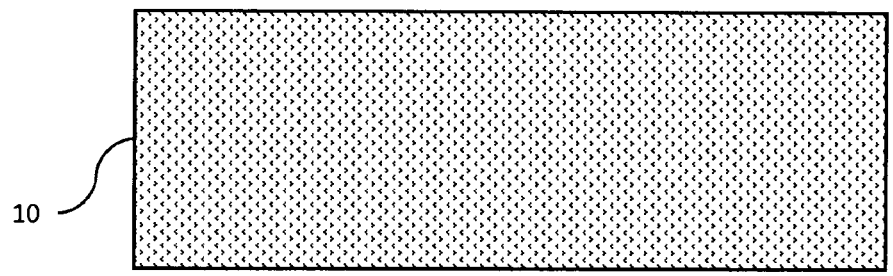

The process starts with a substrate 10 as shown in FIG. 1. The substrate 10 may comprise a silicon on insulator (SOI) substrate wafer of a conventional type (including an extremely thin silicon on insulator (ETSOI) or ultra-thin body and buried oxide (UTBB) silicon on insulator (SOD) known to those skilled in the art). Alternatively, the substrate 10 may comprise a bulk semiconductor substrate wafer. The top semiconductor layer of the SOI substrate or the semiconductor material of the bulk substrate may be doped as appropriate for the integrated circuit application (and in the present implementation the substrate material which will eventually be formed into a fin need not be doped at all). In an embodiment of an SOI substrate, the top semiconductor layer may be of the fully depleted (FD) configuration. The bulk substrate may include, for example, a number of epitaxially grown semiconductor layers. The process techniques described herein are equally applicable to SOI and bulk substrates, as well as other types of substrate, and thus a generic representation of the substrate 10 is shown in FIG. 1 and referenced throughout the description.

Figure 2A:
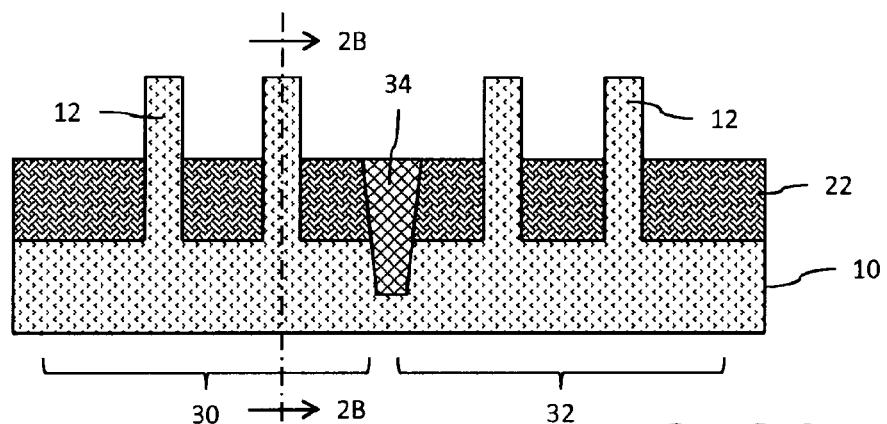
Figure 2B:
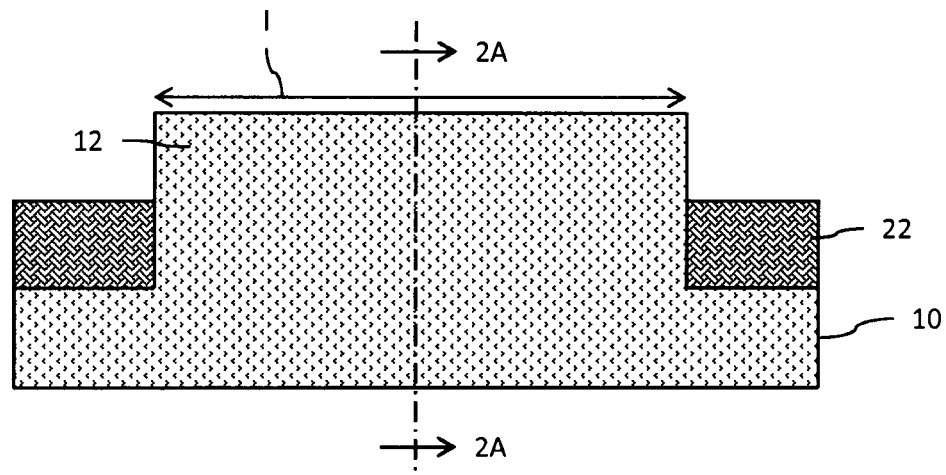

Using fabrication techniques well known to those skilled in the art, a plurality of fins 12 of semiconductor material are formed at the top surface of the substrate 10. The result of the fin fabrication process is shown in cross-sectional FIGS. 2A and 2B, wherein the illustrated orientations of FIGS. 2A and 2B are orthogonal to each other. The fins 12 may, for example, be made of silicon, silicon-germanium, or other suitable semiconductor materials. The fins 12 may, for example, be doped as appropriate for the integrated circuit application. The fins may be separated from each other by a dielectric or other insulating material 22.

Figures 3A, 3B:
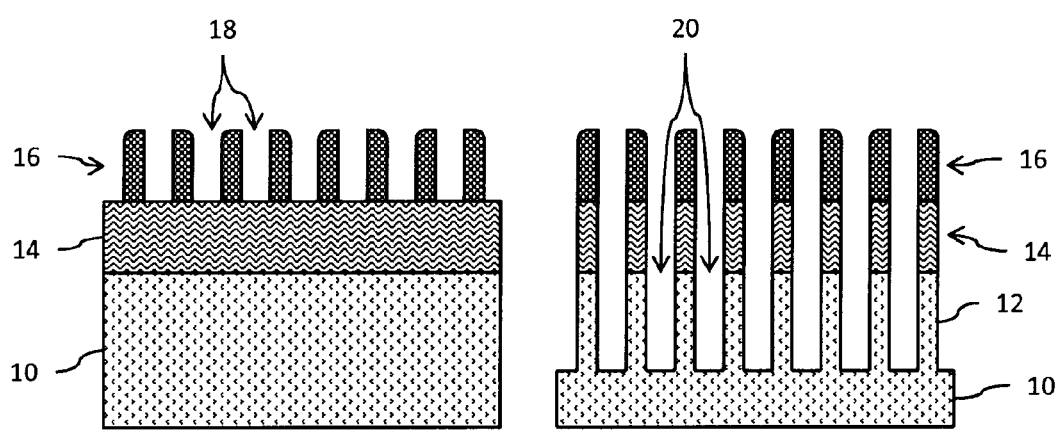
Figure 3C:
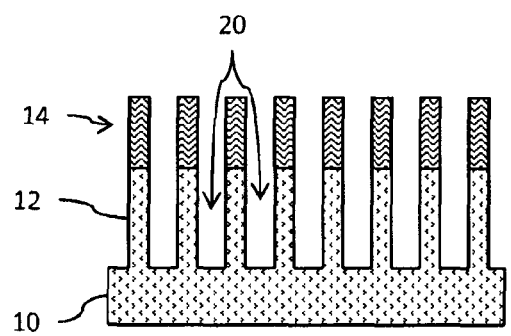
Figure 3D:
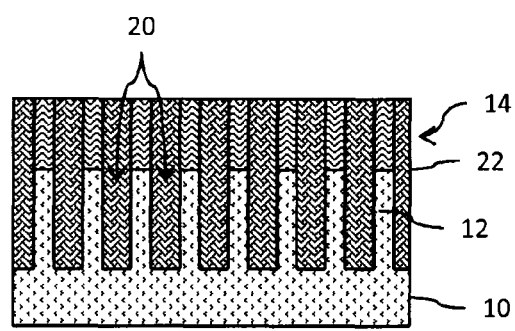
Figure 3E:
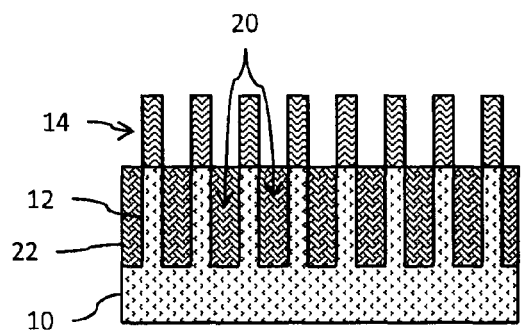
Figure 3F:
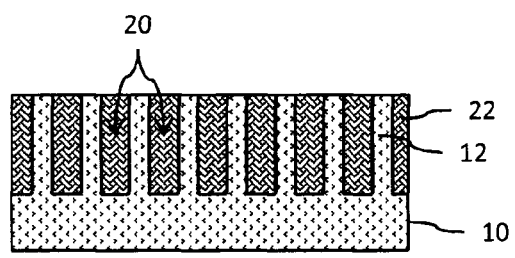
Figure 3G:
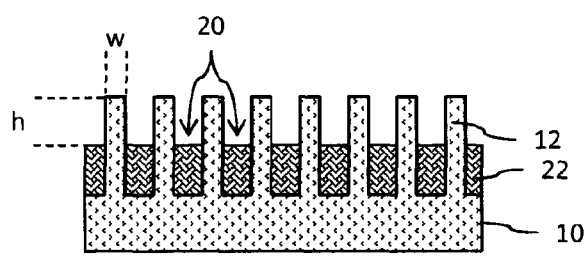

An example of the process for fin fabrication is shown in FIGS. 3A-3G. In FIG. 3A, a hard mask layer 14 (for example, of silicon nitride SiN) is deposited on the substrate 10. Over the hard mask layer 14, a lithographically patterned mask 16 is formed on the hard mask layer 14. The mask 16 includes a number of mask openings 18 with the lithographic patterning leaving mask material at locations where fins 12 are desired. An etching operation is then performed through the openings 18 to define a plurality of apertures 20 in the top surface of the substrate 10 which define the fins 12. The lithographically patterned mask 16 is then removed as shown in FIG. 3C. A dielectric material 22 is then deposited to fill the apertures 20 as shown in FIG. 3D. An upper portion of the dielectric material 22 is then removed through a recessing operation to expose the remaining portions of the hard mask layer 14 as shown in FIG. 3E. The remaining portions of the hard mask layer 14 are then stripped away as shown in FIG. 3F. The upper portion of the remaining dielectric material 22 is then partially recessed to expose the upper portions of the fins 12 as shown in FIG. 3G.

The individual fins 12 may have an exposed height "h" of 30-50 nm and a width "w" of 6-12 nm. The length "l" of each fin 12 is determined by the application of the transistor and may, for example, be 50-100 µm.

The substrate 10 may be divided into a number of different regions. FIG. 2A illustrates the provision of a first region 30 including a plurality of fins 12 and a second region 32 including a plurality of fins 12. The first region 30 may, for example, be associated with the formation of a FinFET transistor having a conventional configuration for use in a CMOS logic circuit application, while the second region 32 may, for example, be associated with the formation of a FinFET transistor having a laterally diffused metal oxide semiconductor (LDMOS) configuration for use in a high power or radio frequency (RF) circuit application.

Depending on substrate type and configuration, as well as the circuit application, an isolation structure 34 may be required to separate the first region 30 from the second region 32. The structure 34 may, for example, comprise a shallow trench isolation (STI) as well known to those skilled in the art.

Figure 4A:
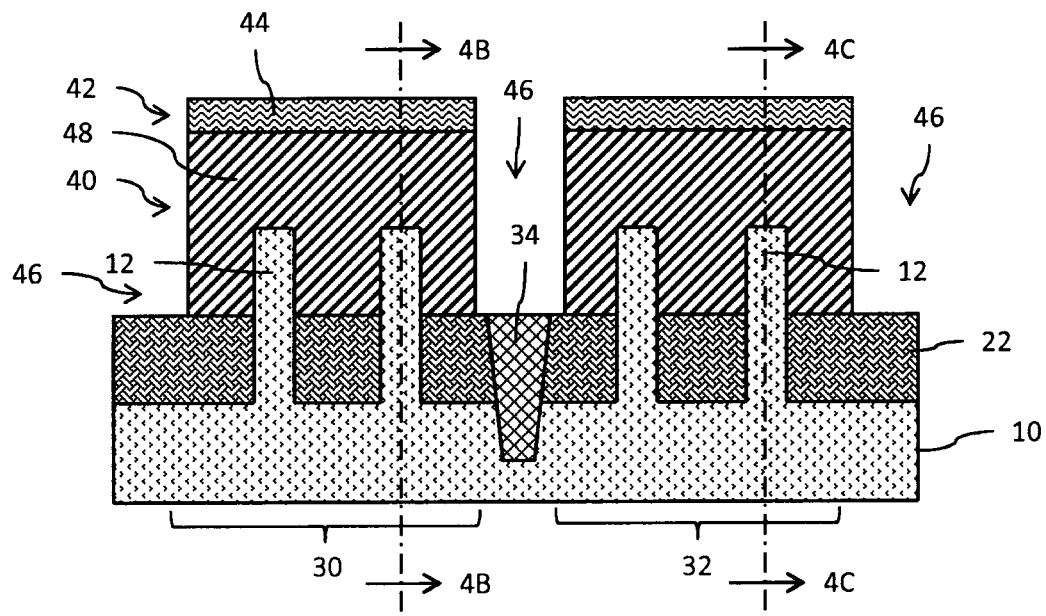
Figure 4B:
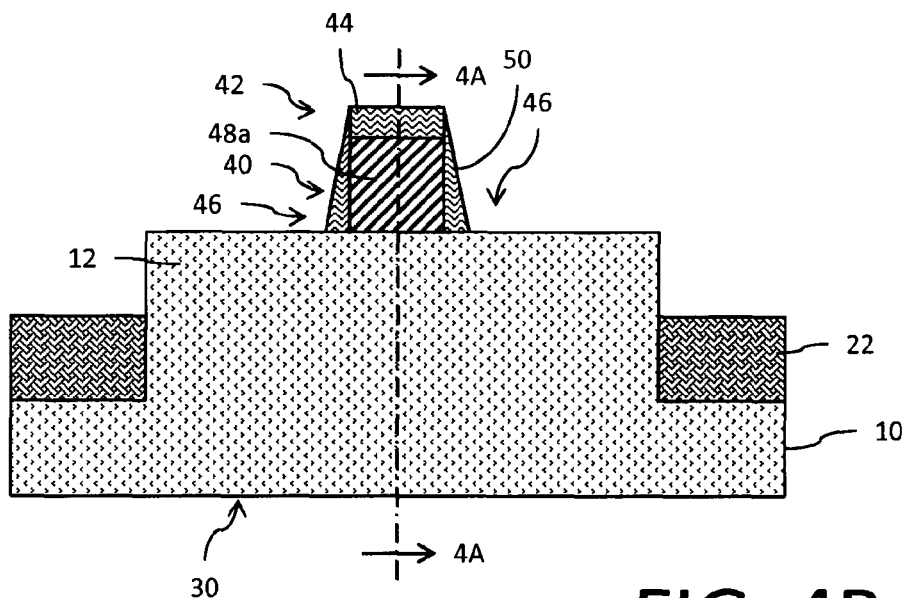
Figure 4C:
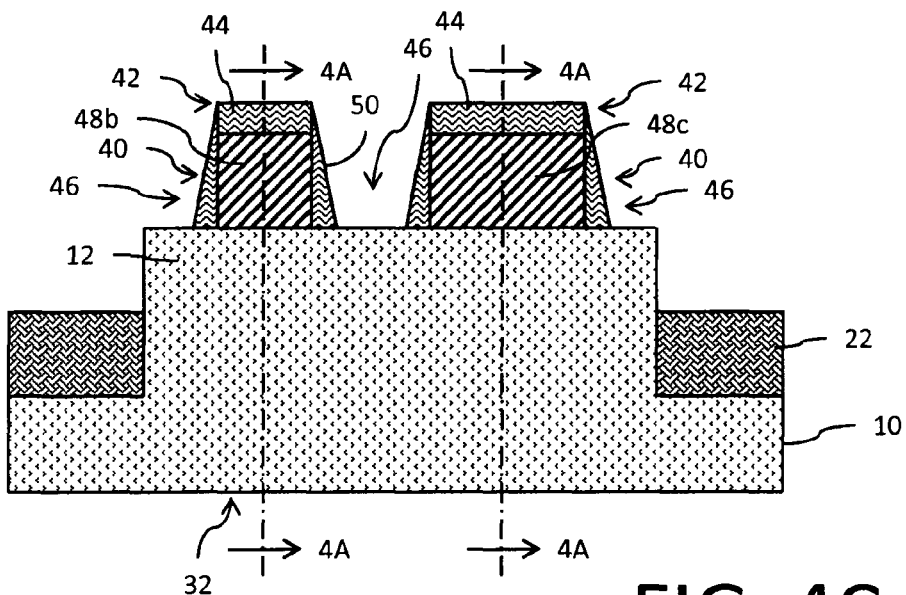

Reference is now made to FIGS. 4A-4C. A sacrificial polysilicon material 40 is deposited using a conventional chemical vapor deposition (CVD) process on the substrate 10 to cover the fins 12 (and the dielectric 22). The polysilicon material 40 may, in an alternative implementation, instead comprise amorphous silicon. A conformal oxide (not explicitly shown) may be formed on the exposed surfaces of the fins 12 prior to deposition of the polysilicon material 40. As understood by those skilled in the art, the polysilicon material (with the oxide) are associated with the formation of structures commonly referred to as "dummy gate" structures. The polysilicon material of the dummy gate structures will be subsequently removed later in the fabrication process and replaced with a metal gate stack defining the actual operating gate electrode for the transistor devices (this process referred to in the art as a "replacement metal gate (RMG)" process). Thus, there is no need to dope the polysilicon material 40. The deposit of the polysilicon material 40 will have a height in excess of the height of the fins 12 so that the fins will be completely covered. The material 40 may have a thickness, for example, of 100-150 nm. The top surface of the polysilicon material 40 deposit is polished using conventional chemical-mechanical planarization (CMP) techniques to provide a planar top surface.

A hard mask layer 42 with a thickness of 20-50 nm is deposited on the planar top surface of the polysilicon material 40 using a chemical vapor deposition (CVD) process. The layer 42 is lithographically patterned in a manner well known to those skilled in the art to leave mask material 44 at desired locations for the dummy gate structures. A reactive ion etch (RIE) is then performed to open apertures 46 in the polysilicon material on either side of the dummy gate 48. The structure of the dummy gate 48 may be considered to straddle over a fin 12, or over a plurality of adjacent fins, at a channel region as described herein (see, FIG. 4A).

The formed dummy gates 48 include a first dummy gate 48a in the region 30 (associated with the formation of the CMOS transistor, for example), and a second dummy gate 48b and a third dummy gate 48c in the region 32 (associated with the formation of the LDMOS transistor, for example).

A silicon nitride material is then deposited, for example, using an atomic layer deposition (ALD) technique as known in the art, and subsequently etched to leave sidewall spacers 50 on the side walls of the polysilicon dummy gates 48.

The dummy gate structure accordingly comprises a patterned polysilicon (or amorphous silicon) dummy gate 48, an overlying silicon nitride cap (formed by the mask material 44) and sidewall spacers 50.

Figure 5A:
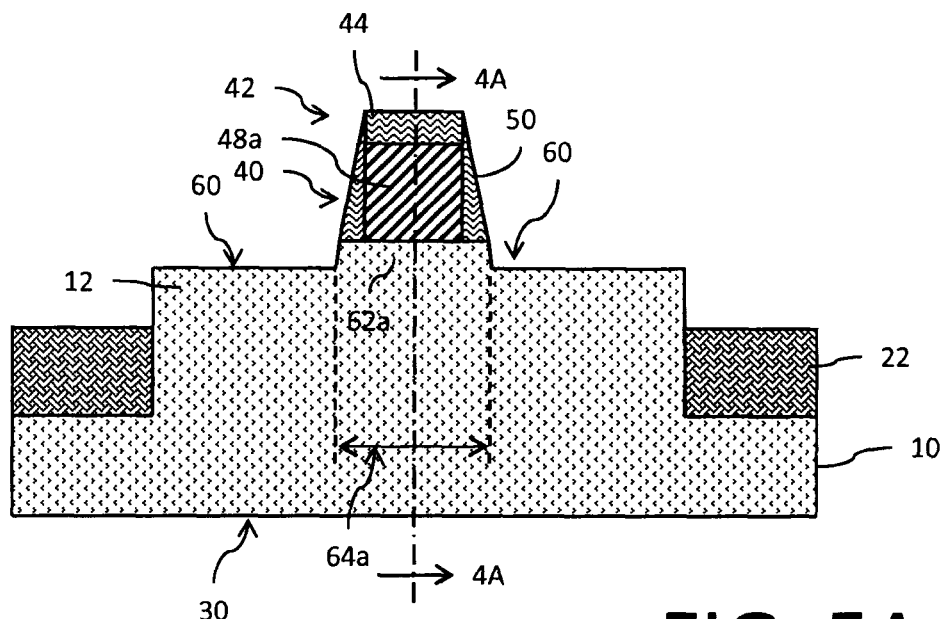
Figure 5B:
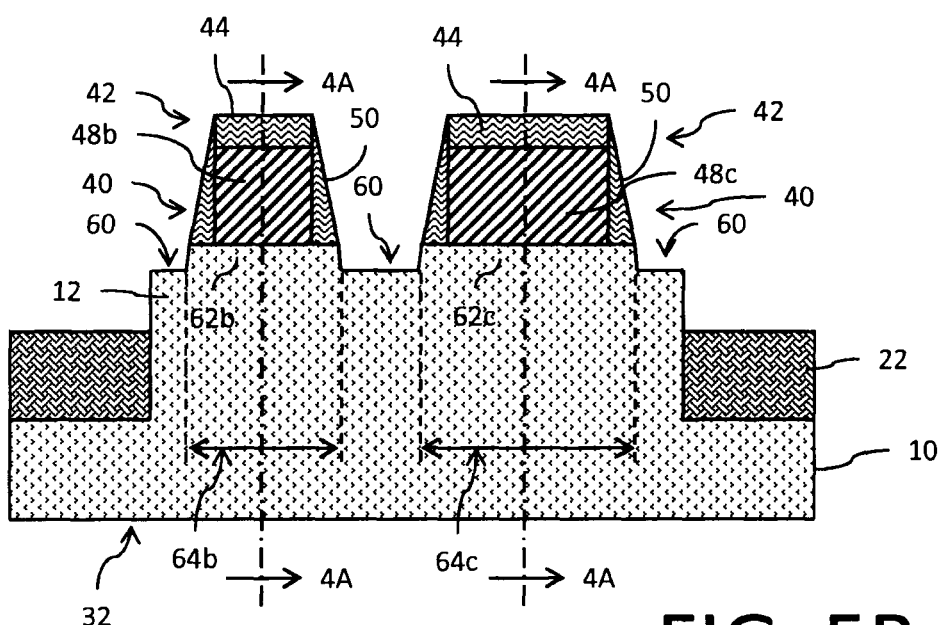

Reference is now made to FIGS. 5A-5B. An etch is then performed to recess 60 the fins 12 on either side of the dummy gate structures. The etch may, for example, comprise an anisotropic (HBr) etch. The depth of the recess 60 may, for example, comprise 20-40 nm. The portion 62 of the fin 12 located under the dummy gates 48 between the recess 60 regions defines a channel region of the FinFET transistor. In this regard, it will be noted that in the region 30 there is a channel region 62a located under the dummy gate 48a, and furthermore that in the region 32 there is a shorter channel region 62b under the dummy gate 48b and a longer channel region 62c under the dummy gate 48c. In an embodiment, the channel region 62a may have a length 64a of 20-50 nm, the shorter channel region 62b may have a length 64b of 100-250 nm, and the longer channel region 62c may have a length 64c of 1-10 µm.

Figure 6A:
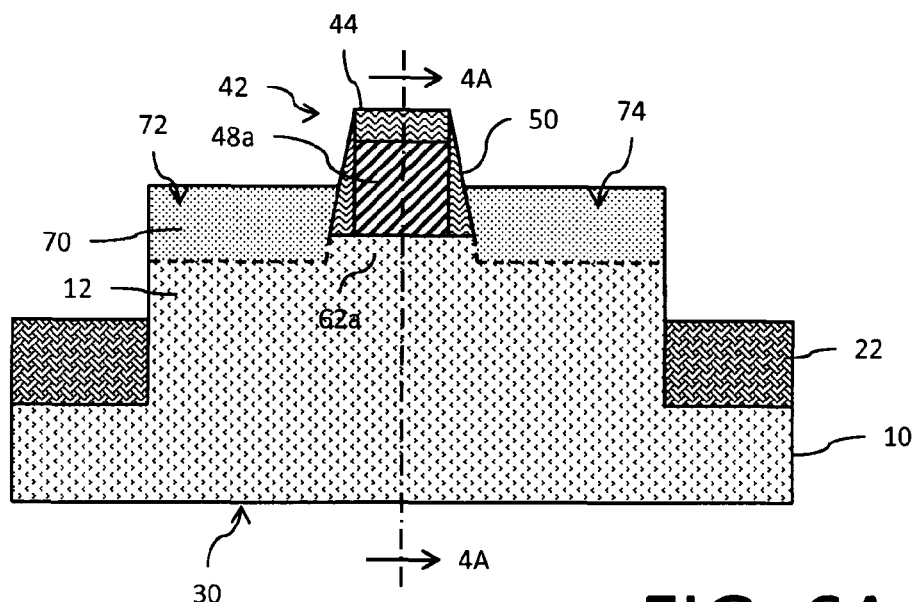
Figure 6B:
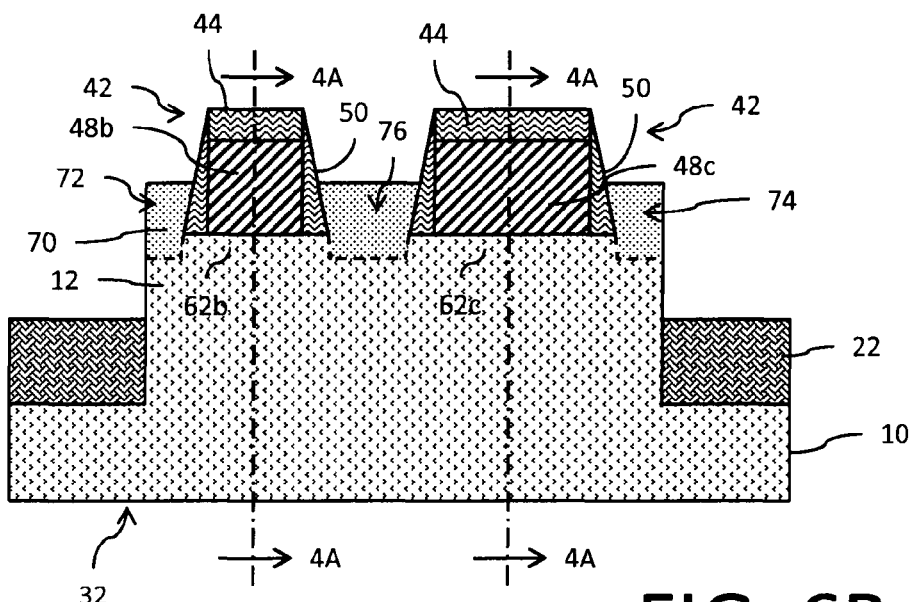

Using an epitaxial process tool and starting from the exposed top surface of the fins 12 in the recess 60 region, an epitaxial growth 70 of a silicon-based semiconductor material is made. The epitaxial growth 70 not only fills the recess 60 regions (adjacent the channel portion 62) but further extends above the previous top surface of the fins to regions adjacent the sidewall spacers 50 on either side of the dummy gate structures. The silicon-based epitaxial growth 70 may be in situ highly doped as needed for a given application. As a result of the epitaxial growth 70, raised source and drain regions 72 and 74, respectively, are formed on either side of the dummy gate structures. With respect to the region 32, a raised intermediate region 76 is formed between the dummy gates 48b and 48c (this region 76 associated with the LDMOS structure as will be described below). The result is shown in FIGS. 6A-6B. The epitaxial growth 70 may comprise, for example: silicon highly doped with boron or indium; silicon-germanium highly doped with boron or indium; silicon highly doped with phosphorous or arsenic; or silicon-carbide highly doped with phosphorous or arsenic. In this context, highly doped means a doping concentration of $1 \times 10^{20}$ to $1 \times 10^{21}$ cm$^{-3}$. It will be understood that different regions of the substrate may utilize different materials for the epitaxial growth to account for, for example, the need to make transistors of the n-channel or p-channel type.

Figure 7A:
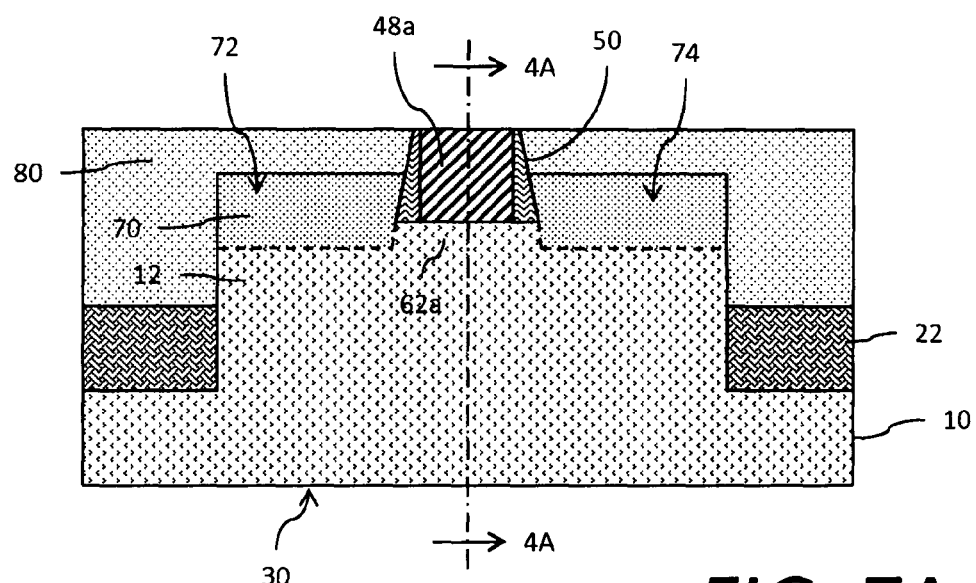
Figure 7B:
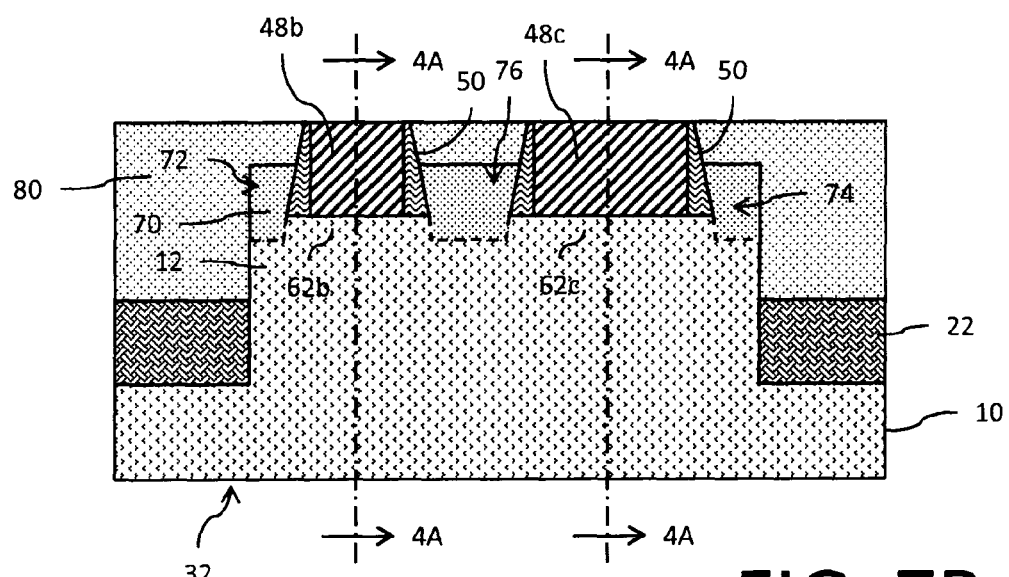

Reference is now made to FIGS. 7A-7B. A silicon dioxide material 80 is deposited to cover the substrate. The material 80 may be further processed using conventional chemical-mechanical planarization (CMP) techniques to provide a planar top surface that stops at the top of each dummy gate 48.

Figure 8A:
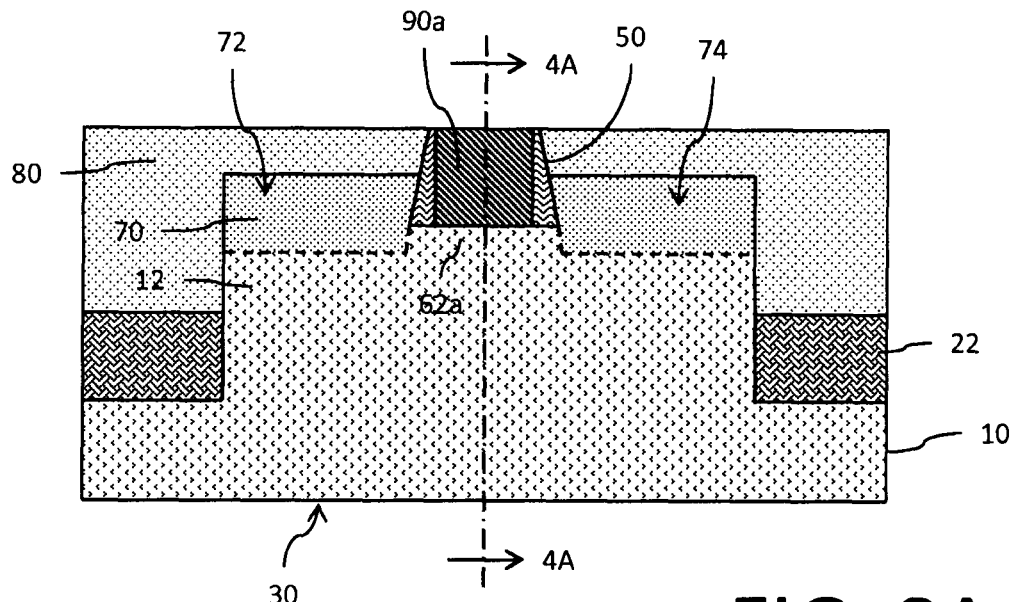
Figure 8B:
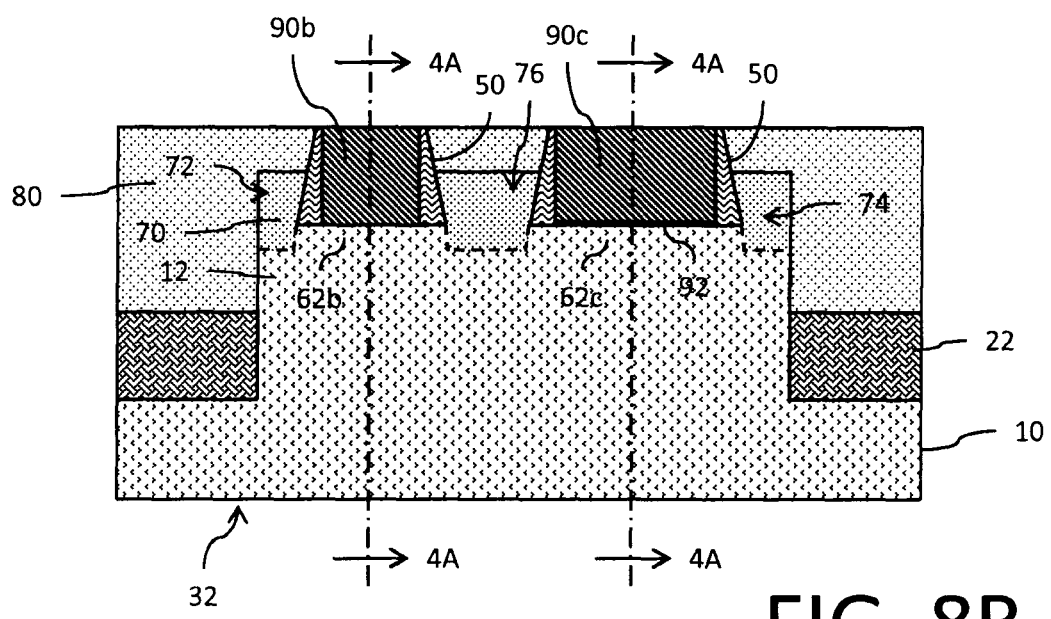

Using a selective removal process (such as an ammonium hydroxide etch), the dummy gates 48 are removed. The removed dummy gates 48 are then replaced with a metal gate structure 90a, 90b and 90c. In an example, the metal gate structure may comprise a high-K dielectric liner (forming the gate dielectric for the transistor) deposited using an atomic layer deposition (ALD) process with a thickness of 1-2 nm, a work function metal deposited using a chemical vapor deposition process and a contact metal fill deposited using a chemical vapor deposition process. The metal gate structure 90c differs from the metal gate structures 90a and 90b in that the metal gate structure 90c has been configured to alter the threshold voltage for metal gate structure 90c in comparison to the metal gate structure 90b. As an example, the metal gate structure 90c may include a dipole layer 92 that provides for a relatively higher threshold voltage (Vt). The dipole layer 92 is typically a thin layer provided between the gate dielectric (for example, a high-K dielectric such as HfO$_2$) and the work function metal which alters the transistor threshold voltage. Examples of suitable materials for the layer 92 include: LaO$_x$ to reduce NFET Vt while increasing PFET Vt, and AlO$_x$ to increase NFET Vt while decreasing PFET Vt. Alternatively, the metal gate structure 90c may include different work function metal(s) to adjust the threshold voltage. Any suitable technique may be used for providing the transistors associated with metal gate structures 90b and 90c with different threshold voltages. The result is shown in FIGS. 8A-8B.

Figure 9A:
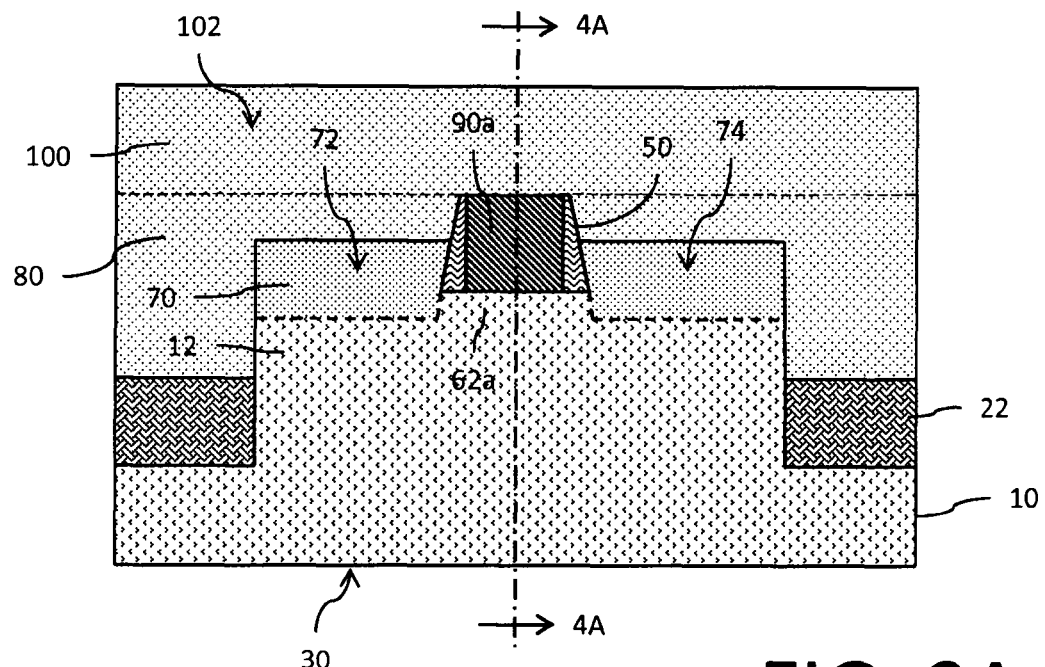
Figure 9B:
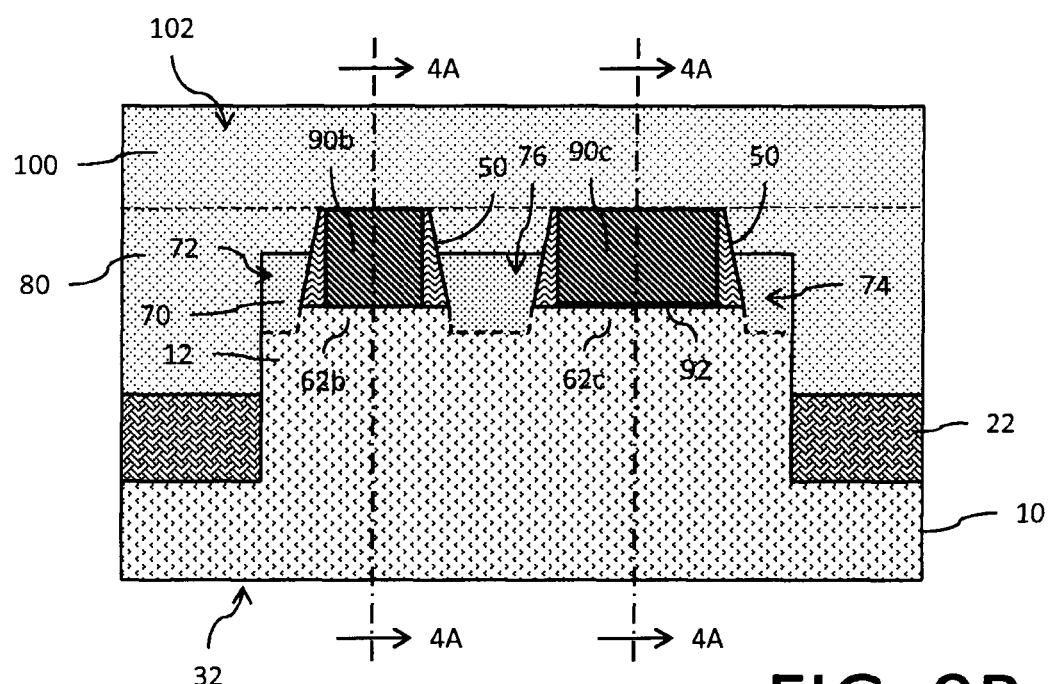

Additional silicon dioxide material 100 is then deposited to complete the formation of the pre-metallization dielectric (PMD) level 102 for the integrated circuit. The material 100 may be further processed using conventional chemical-mechanical planarization (CMP) techniques to provide a planar top surface. The result is shown in FIGS. 9A-9B.

Figure 10A:
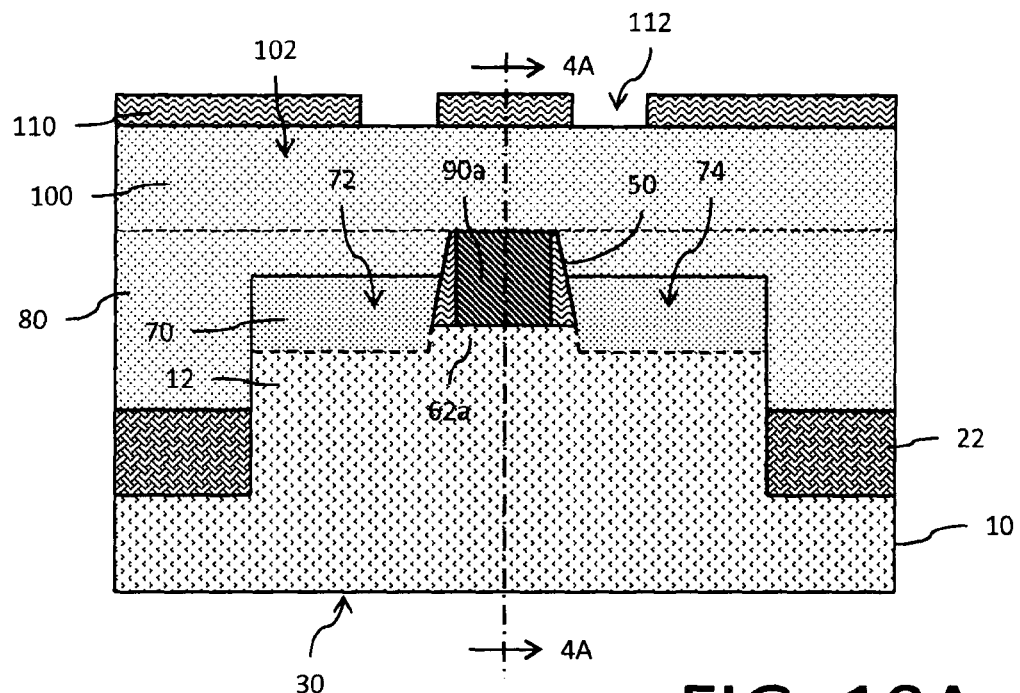
Figure 10B:
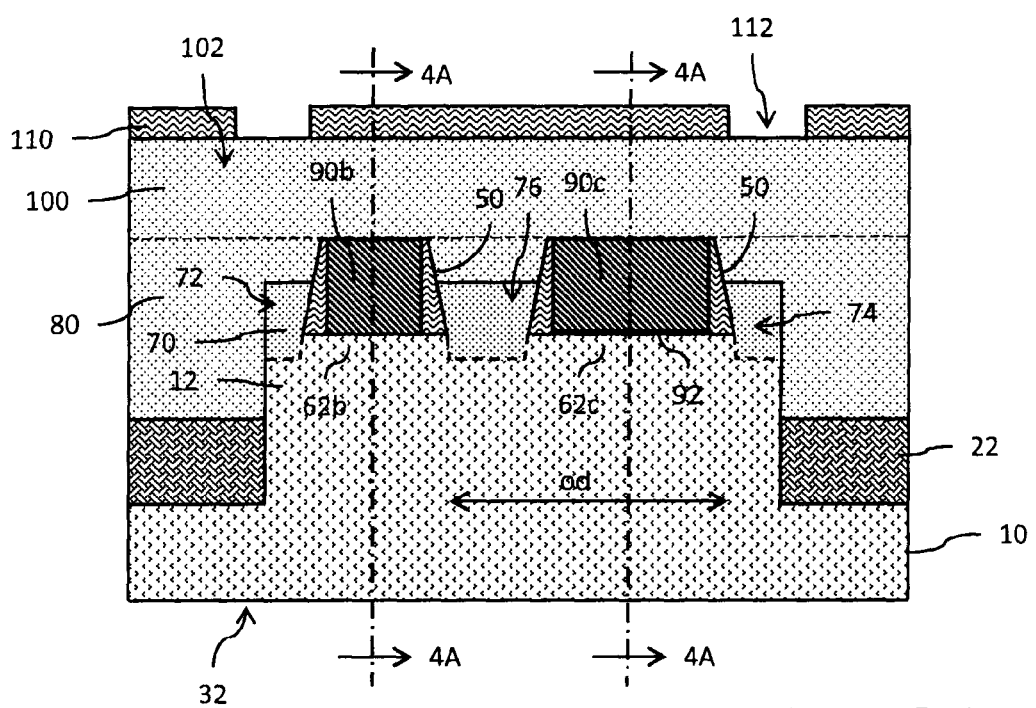

A hard mask layer 110, for example an organic planarization layer (OPL) having a thickness of 100-500 nm, is then deposited on the planar top surface of the PMD layer 102 using a coating process. The layer 110 is lithographically patterned in a manner well known to those skilled in the art to form openings 112 at desired locations for making electrical contact to the source and drain regions 72 and 74, respectively. With respect to the region 30, as shown in FIG. 10A, the openings 112 are aligned at positions adjacent the sidewall spacers 50 on opposite sides of the metal gate structure 90a. With respect to the region 32, as shown in FIG. 10B, the opening for the source region 72 is aligned at a position adjacent the sidewall spacer 50 on the source side of the metal gate structure 90b, while the opening for the drain region 74 is aligned at a position adjacent the sidewall spacer 50 on the drain side of the metal gate structure 90c.

It will be noted that the opening 112 for the contact to the drain region 74 is offset by an offset distance "od" from the sidewall spacer 50 on the drain side of the metal gate structure 90b. In an example, for a transistor with a channel region 62b having a channel length of 100-250 nm the offset distance may comprise 1-10 µm. It is further noted that no opening is provided to make contact to the region 76. In this configuration, the channel regions 62b and 62c are coupled in series with each other through region 76, with the metal gate structure 90b associated with a main transistor and metal gate structure 90c associated with an auxiliary transistor whose source-drain paths are coupled in series. The main and auxiliary transistors, in combination, form the FinFET device with an LDMOS configuration.

Figure 11A:
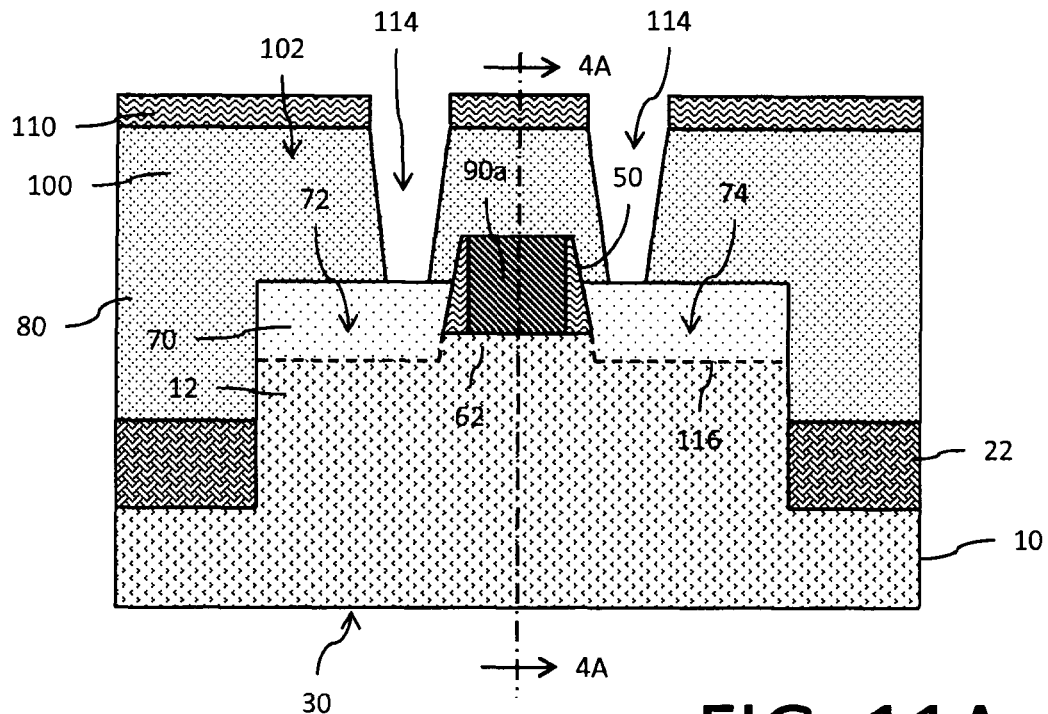
Figure 11B:
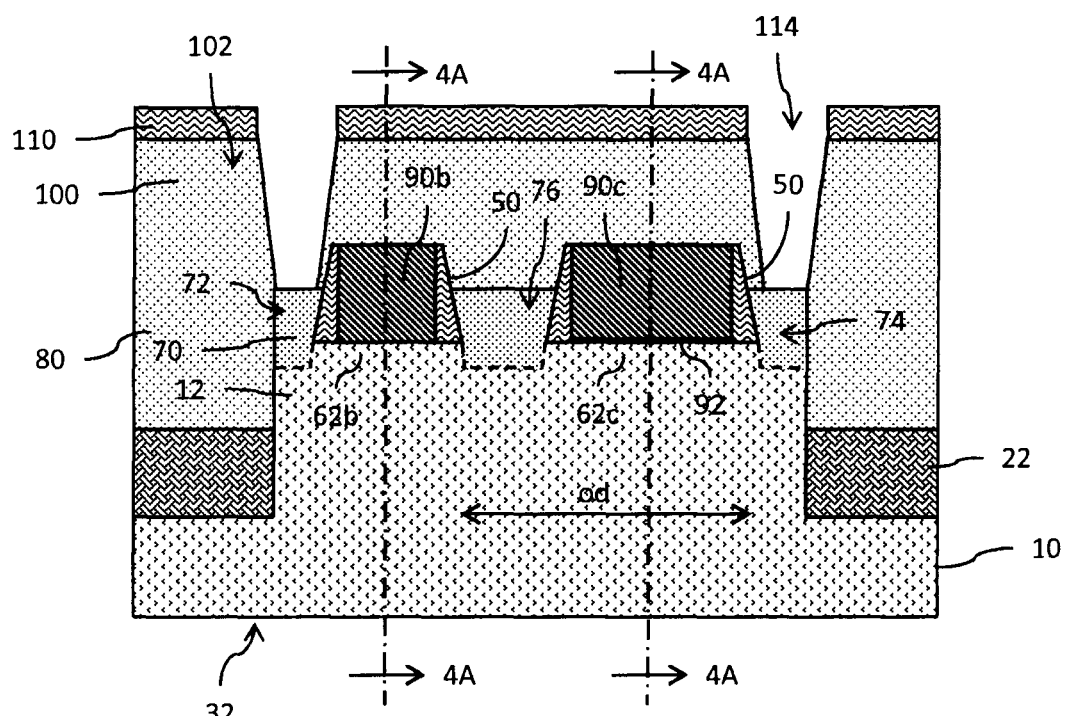

A reactive ion etch (RIE) is then performed to open and extend apertures 114 completely through the pre-metallization dielectric (PMD) 102 (materials 80 and 100) to expose a top surface of (and perhaps penetrate slightly into) the heavily doped epitaxial growth 70 at the source and drain regions. The result is shown in FIGS. 11A-11B.

The mask layer 110 is then removed.

Figure 12A:
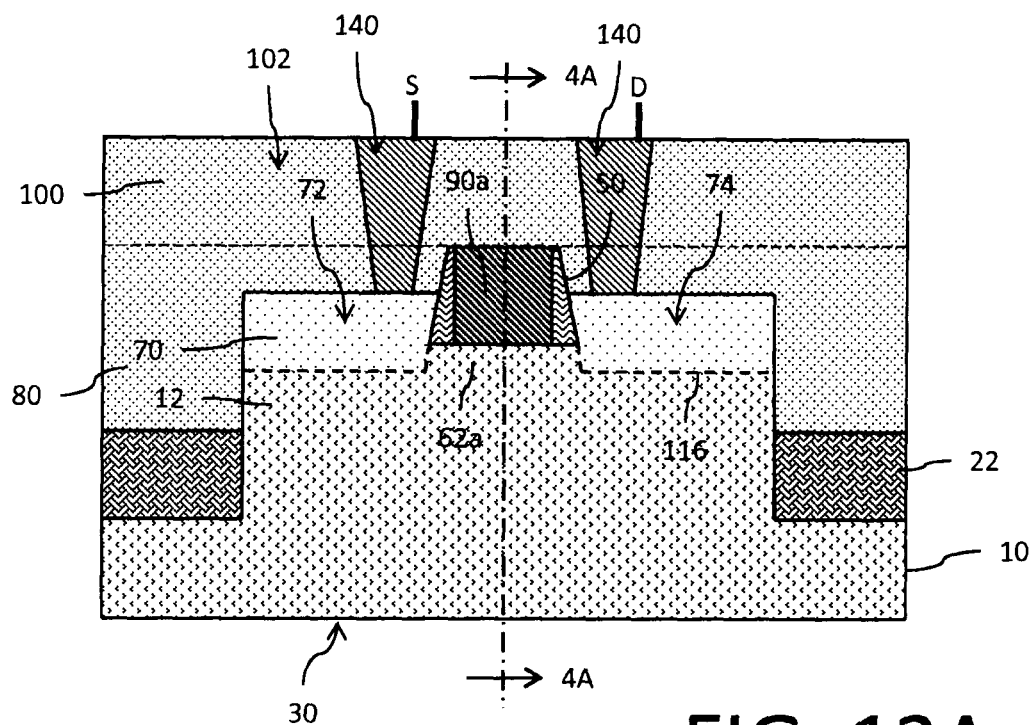
Figure 12B:
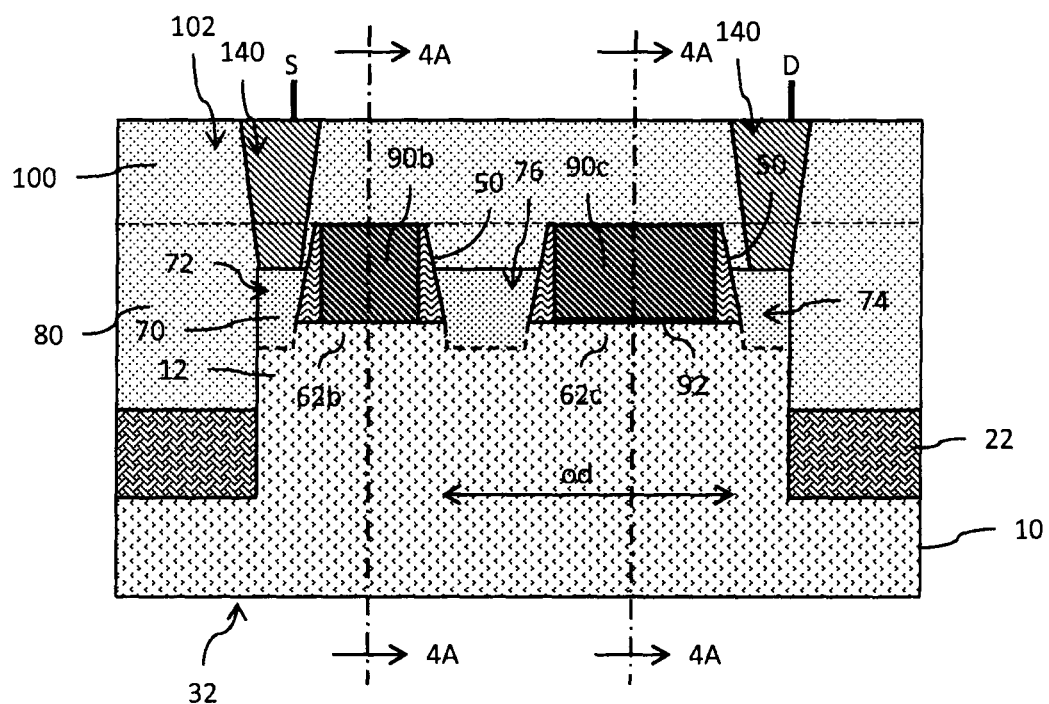

Reference is now made to FIGS. 12A-12B. The apertures 114 are then filled with metal material(s) to define a contact 140 made to the source and drain regions of the transistor. As necessary, a conventional chemical-mechanical planarization (CMP) technique may be used to remove excess metal so as to provide a planar top surface. The metal materials defining the contact 140 may, for example, comprise tungsten deposited using a chemical vapor deposition process.

The fabrication process is compatible with the formation of a silicide at the bottom of the contact 140. The techniques for salicidation are well known to those skilled in the art. The silicide may, for example, comprise a typical nickel platinum silicide or alternatively a silicide arising from the use of a titanium nitride liner for the contact 140.

Figure 13A:
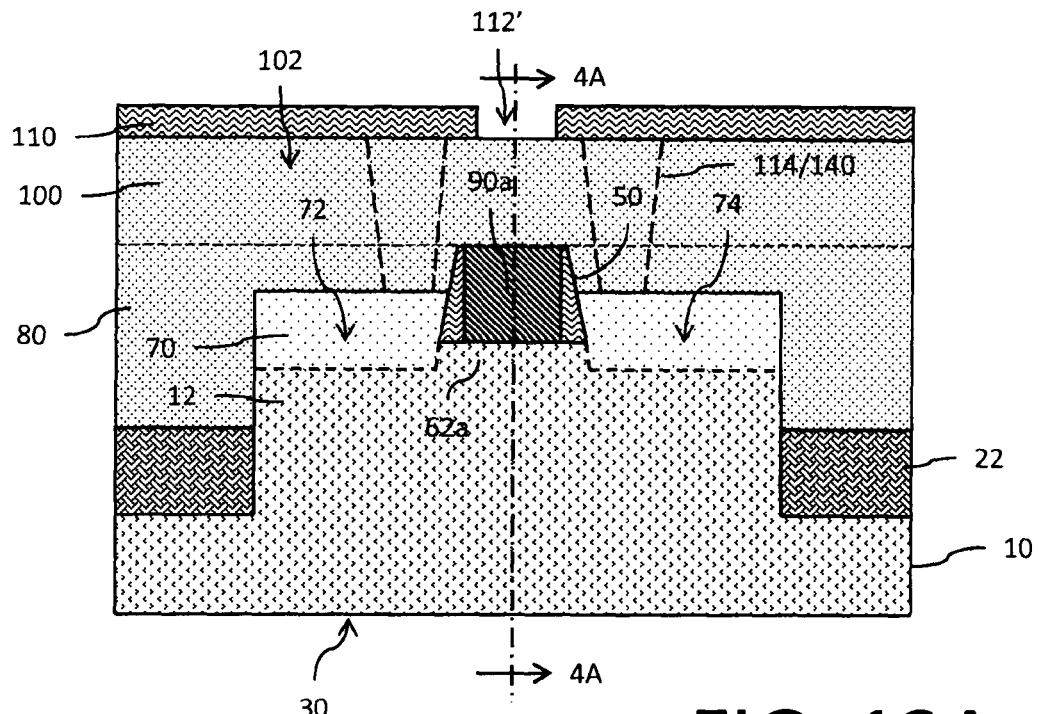
Figure 13B:
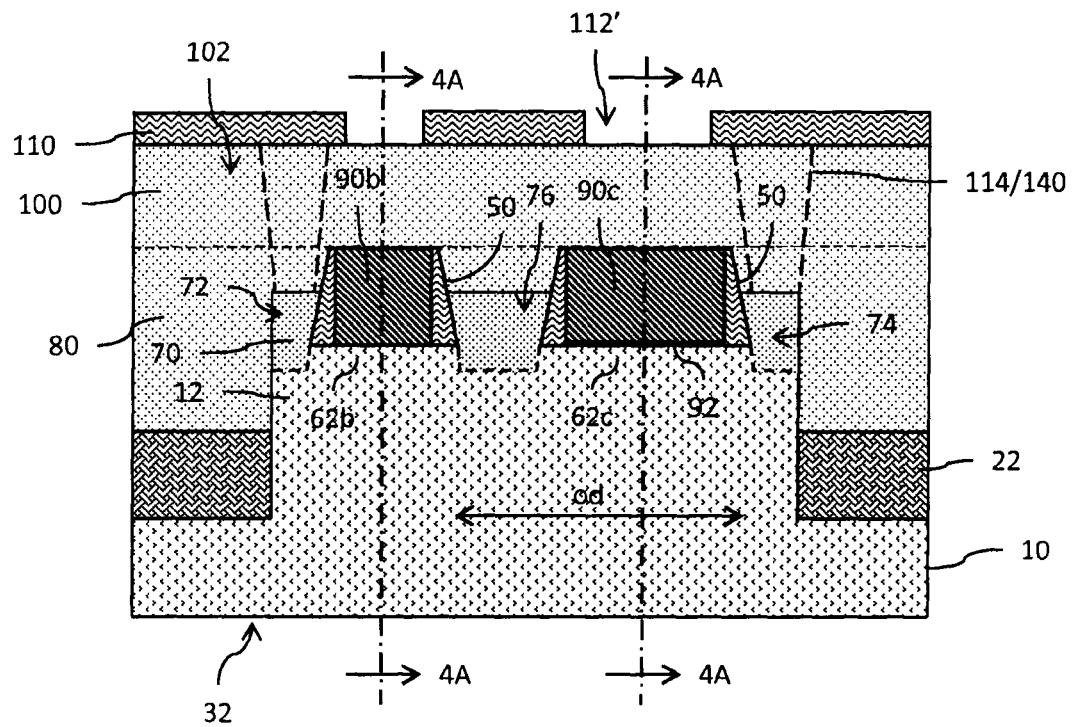

The hard mask layer deposited on the planar top surface of the PMD layer 102 may also be lithographically patterned in a manner well known to those skilled in the art to form openings 112' at desired locations for making electrical contact to the gate regions. This is shown in FIGS. 13A-13B. It is noted that the openings 112' shown in FIGS. 13A-13B may be formed in a different plane than the openings 112 shown in FIGS. 10A-10B, or if space allows may be formed in the same plane. This is indicated by the dotted lines for the source/drain contacts.

Figure 14A:
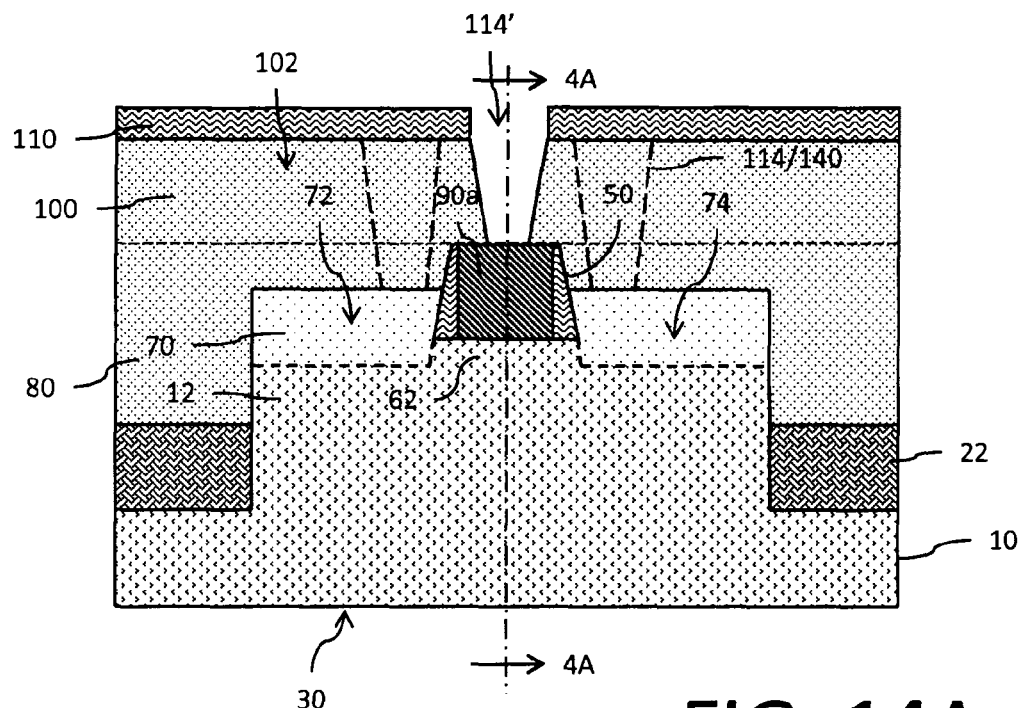
Figure 14B:
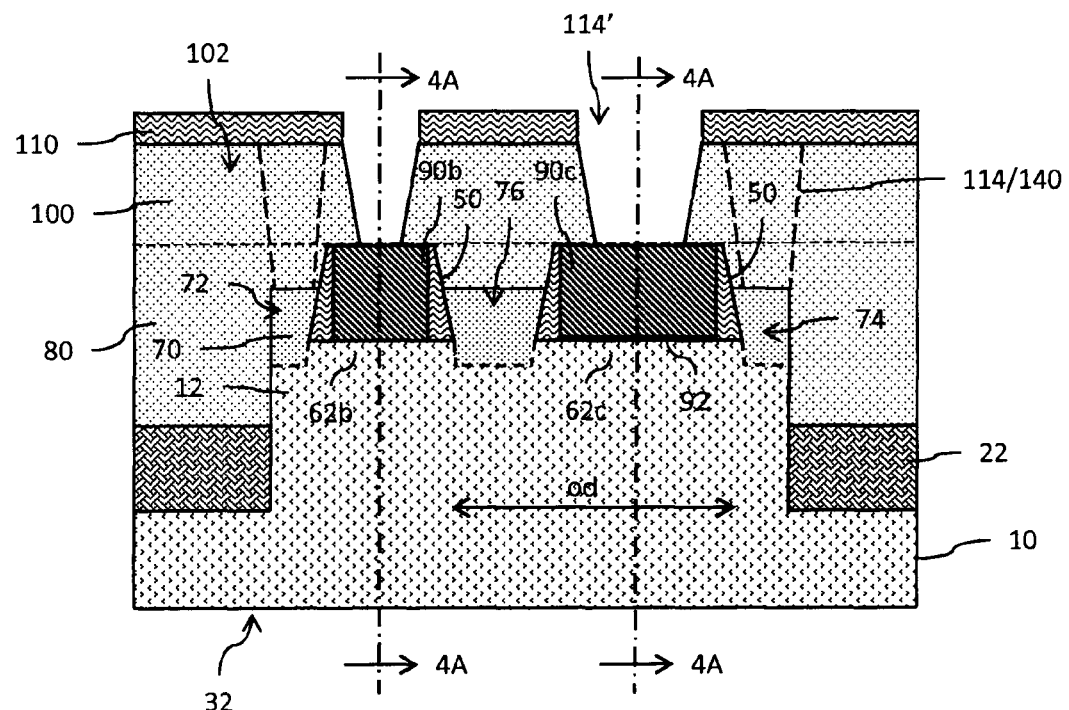

A reactive ion etch (RIE) is then performed to open and extend apertures 114' completely through the pre-metallization dielectric (PMD) 102 (material 100) to reach an upper conductive surface of the metal gate structure 90. The result is shown in FIGS. 14A-14B. It will be understood that the etching operations of FIGS. 11A-11B and 14A-14B may occur simultaneously.

Figure 15A:
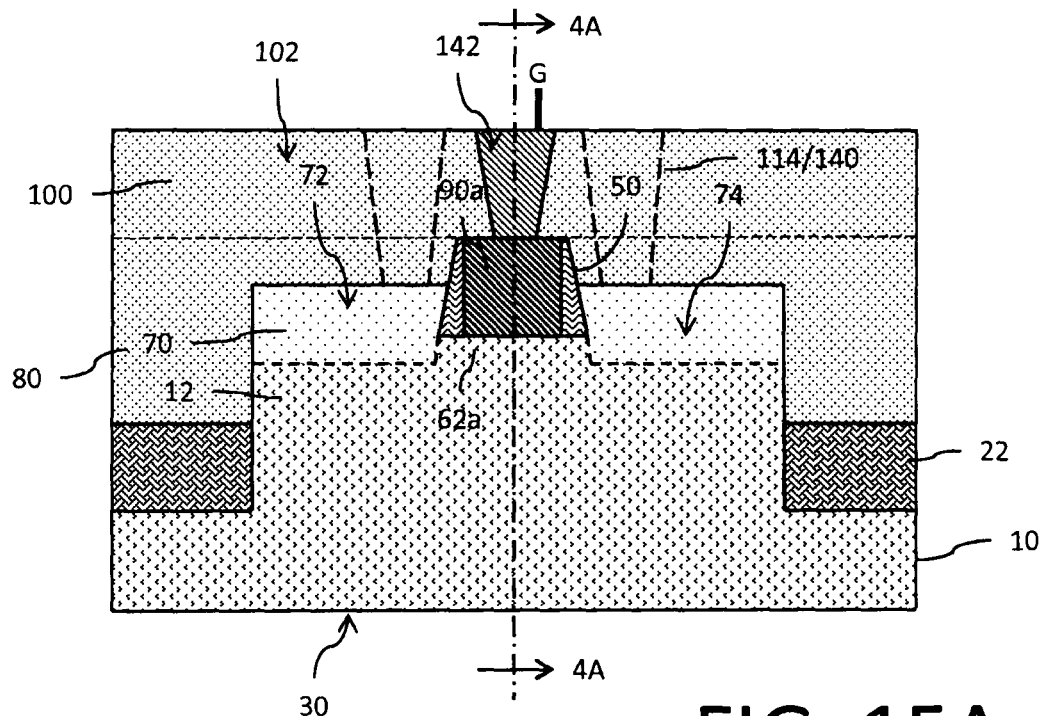
Figure 15B:
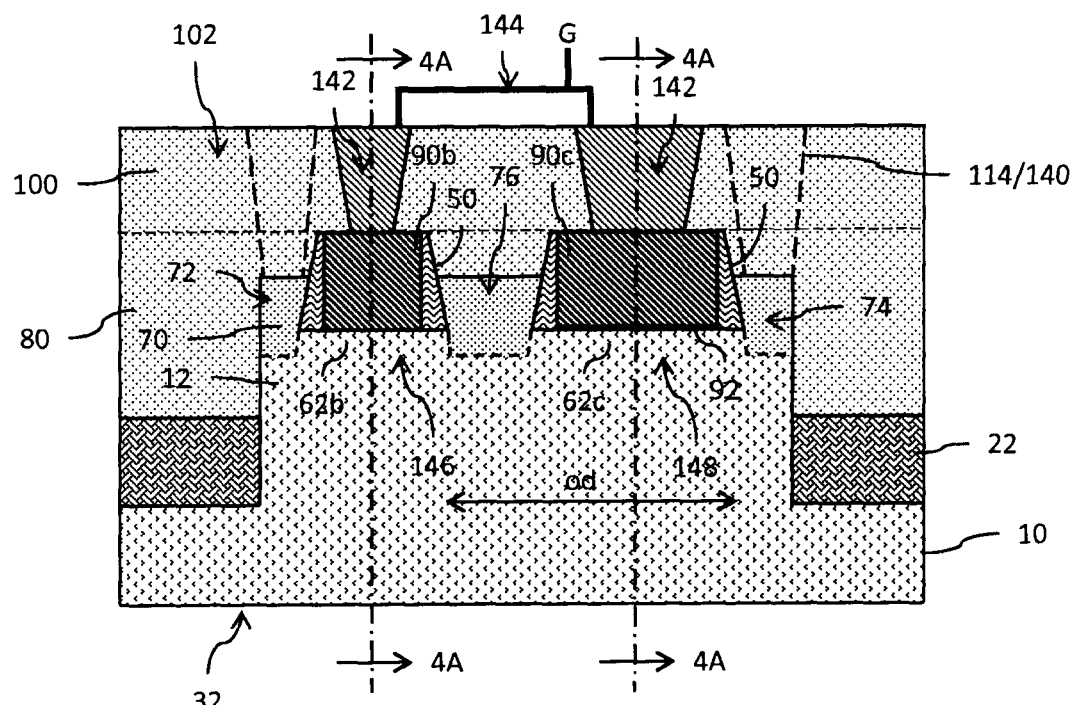

The apertures 114' are then filled with metal material(s) to define a contact 142 made to the metal gate structures 90 of the transistor. The result is shown in FIGS. 15A-15B. It will be understood that the filling operations of FIGS. 12A-12B and 15A-15B may occur simultaneously. As necessary, a conventional chemical-mechanical planarization (CMP) technique may be used to remove excess metal so as to provide a planar top surface. The metal materials defining the contact 142 may, for example, comprise tungsten deposited using a chemical vapor deposition process.

With specific reference to FIG. 15A and the transistors of the region 30 (used for CMOS circuits, for example), the contacts 140 for the source and drain regions (72, 74) are immediately adjacent the channel region 62a. For the transistors of region 32 as illustrated in FIG. 15B (used for the LDMOS devices, for example), however, the contact 140 for the source region 72 is immediately adjacent the channel region 62b, but the contact 140 for the drain region 74 is immediately adjacent the channel region 62c and offset by the offset distance "od" from the channel region 62a with the intervening epitaxial region 76 and channel region 62c defining the laterally diffused metal oxide semiconductor (LDMOS) configuration. When a control voltage is applied to both the metal gate structures 90ba and 90c (see, short circuit connection 144 for the gate (G)), the applied voltage may be selected to cause a main transistor 146 associated with metal gate structure 90b to operate in the saturation region of operation while an auxiliary transistor 148 associated with metal gate structure 90c operates in the linear region of operation (due to a relatively higher threshold voltage (Vt) introduced by the dipole layer difference in work function metal, for example). In this configuration, the intervening epitaxial region 76 and channel region 62c provides a high resistivity drain extension that is useful in transistors operating at higher voltages.

At this point, front end of line (FEOL) fabrication of the integrated circuit is complete. Further back end of line (BEOL) processing to fabricate metallizations and interconnects may then be performed as well known to those skilled in the art. Included within this BEOL process is the fabrication of the short circuit connection 144. Alternatively, the short circuit connection 144 may be fabricated within the pre-metallization dielectric (PMD) 102.

Reference is now made to FIGS. 1-7B and 16A-24B showing process steps for the formation of a FinFET device having a laterally diffused metal oxide semiconductor (LDMOS) configuration. It will be understood that the illustrations provided do not necessarily show the features drawn to scale.

The description of FIGS. 1-7B is provided above and is incorporated herein by reference.

Figure 16A:
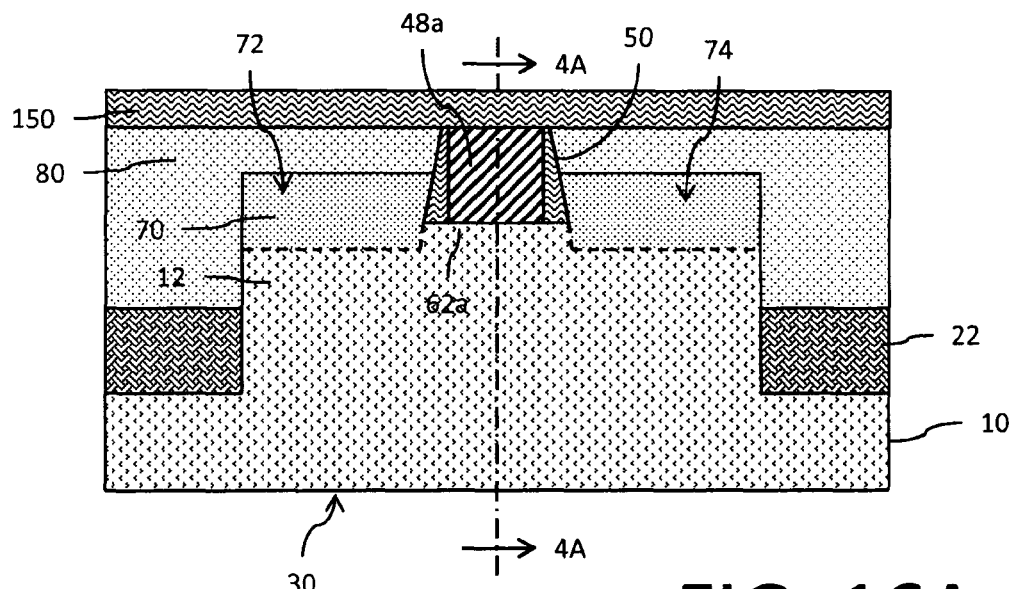
Figure 16B:
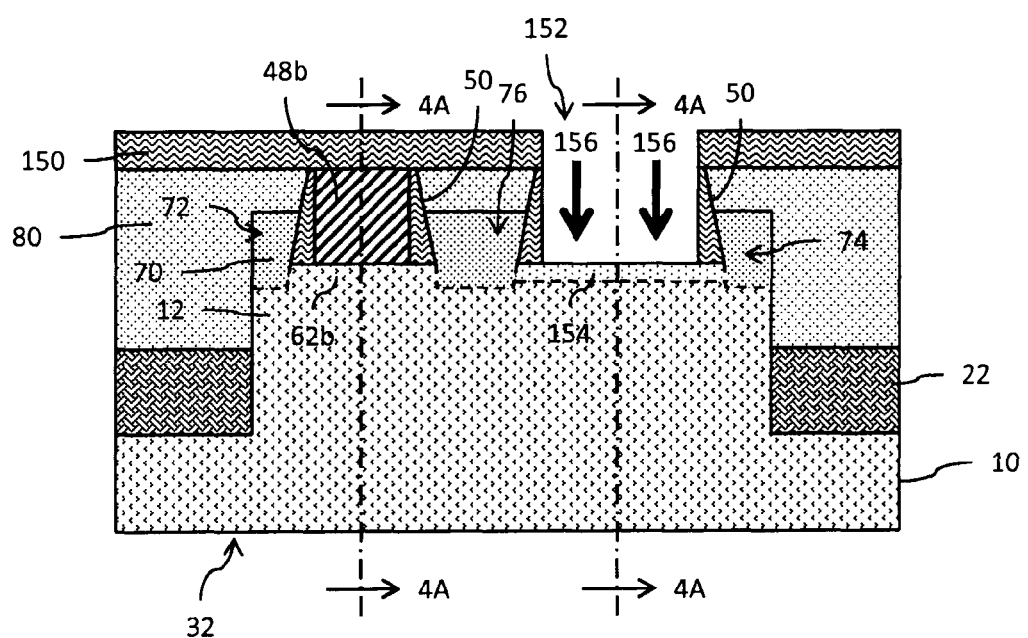

A masking layer 150 may be provided to cover the wafer, with the masking layer 150 including openings 152 at locations over the dummy gate 48c. Using a selective removal process (such as an ammonium hydroxide etch performed through the openings 152), the dummy gate 48c is removed to expose the upper surface of the channel region 62c. A conventional dopant implant process 156 is then used to implant a dopant through the upper surface of the channel region 62 and into the fin 12. The dopant species may comprise, for example, boron, indium, phosphorous or arsenic, selected in accordance with the transistor conductivity type. A dopant activating anneal is then performed to provide a lightly doped channel region 154 within the fin 12 which preferably extends between the region 74 and the region 76. The result is shown in FIGS. 16A-16B. In this context, lightly doped means a doping concentration of $1 \times 10^{18}$ to $1 \times 10^{19}$ cm$^{-3}$.

Figure 17A:
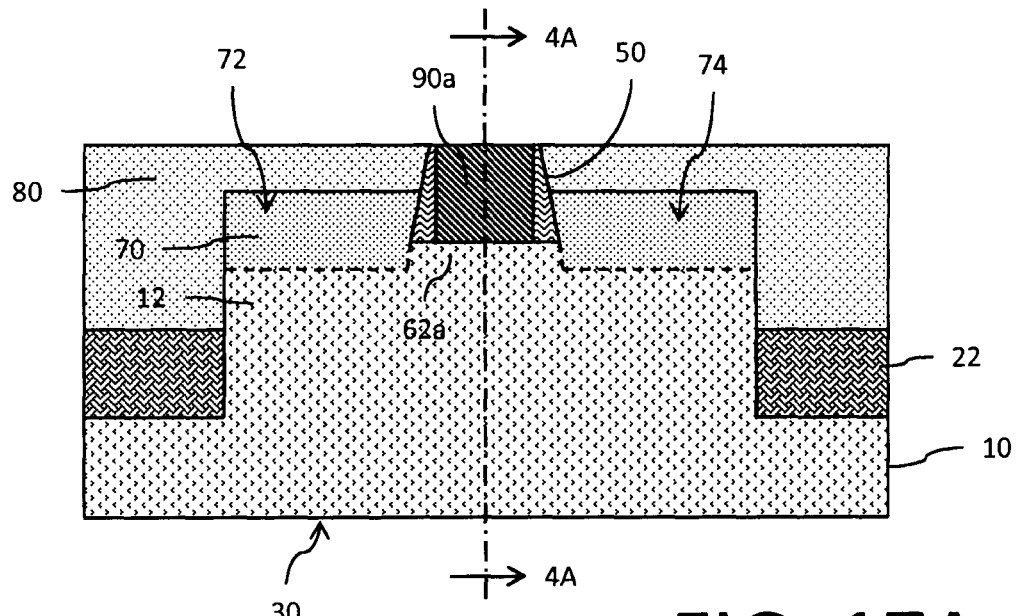
Figure 17B:
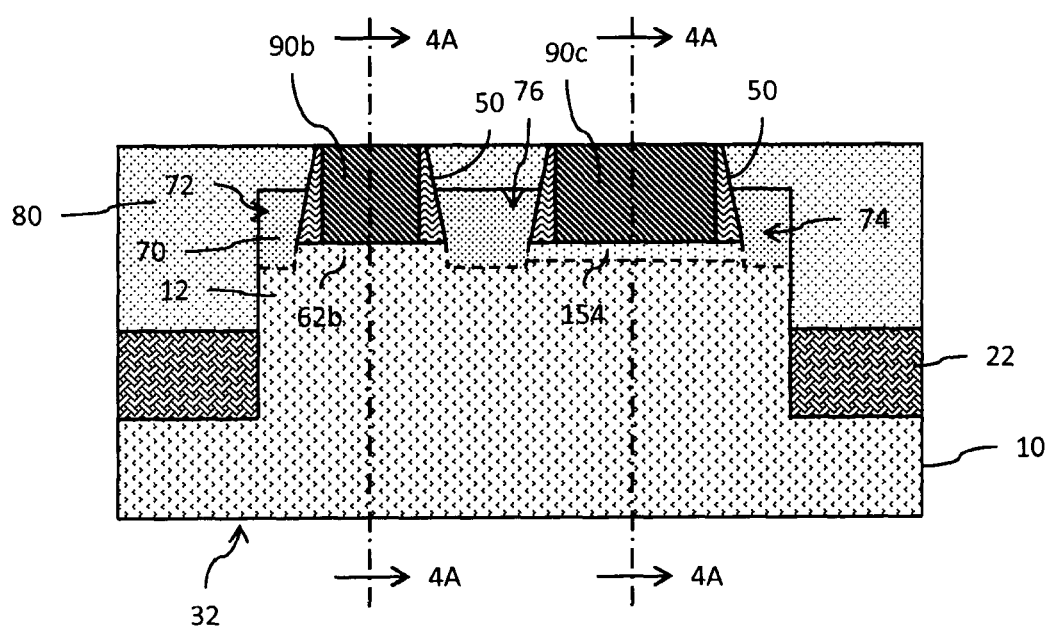

The masking layer 150 is then removed and a selective removal process (such as an ammonium hydroxide etch) is performed to remove the dummy gates 48a and 48b. The removed dummy gates 48 are then replaced with metal gate structures 90a, 90b and 90c. In an example, the metal gate structure may comprise a high-K dielectric liner (forming the gate dielectric for the transistor) deposited using an atomic layer deposition (ALD) process with a thickness of 1-2 nm, a work function metal deposited using a chemical vapor deposition process and a contact metal fill deposited using a chemical vapor deposition process. The result is shown in FIGS. 17A-17B.

Figure 18A:
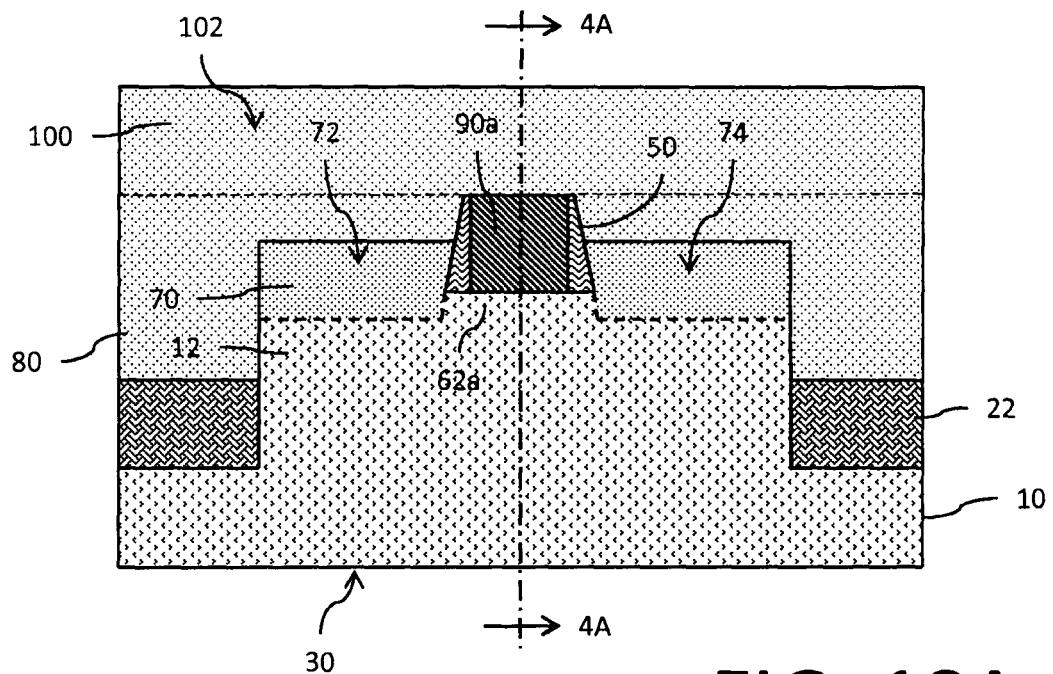
Figure 18B:
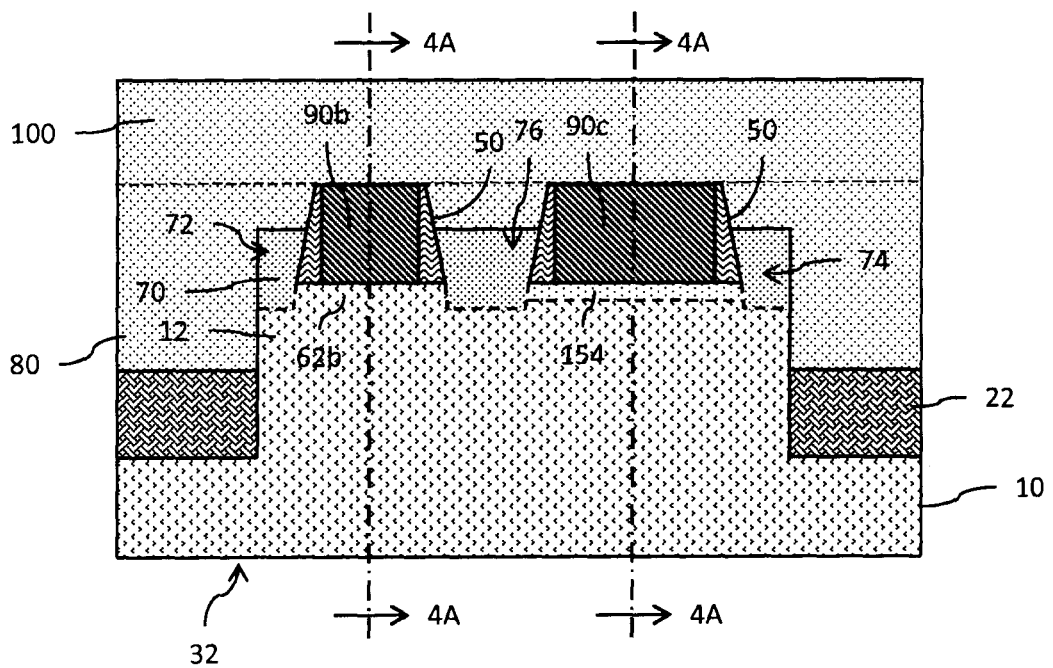

Additional silicon dioxide material 100 is then deposited to complete the formation of the pre-metallization dielectric (PMD) level 102 for the integrated circuit. The material 100 may be further processed using conventional chemical-mechanical planarization (CMP) techniques to provide a planar top surface. The result is shown in FIGS. 18A-18B.

Figure 19A:
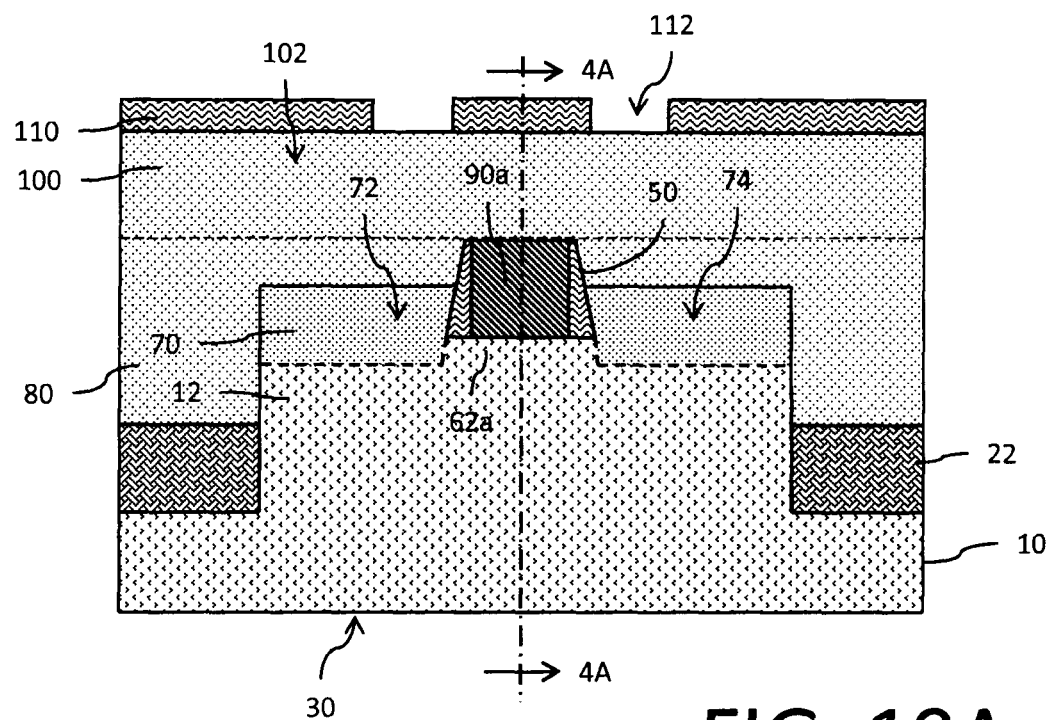
Figure 19B:
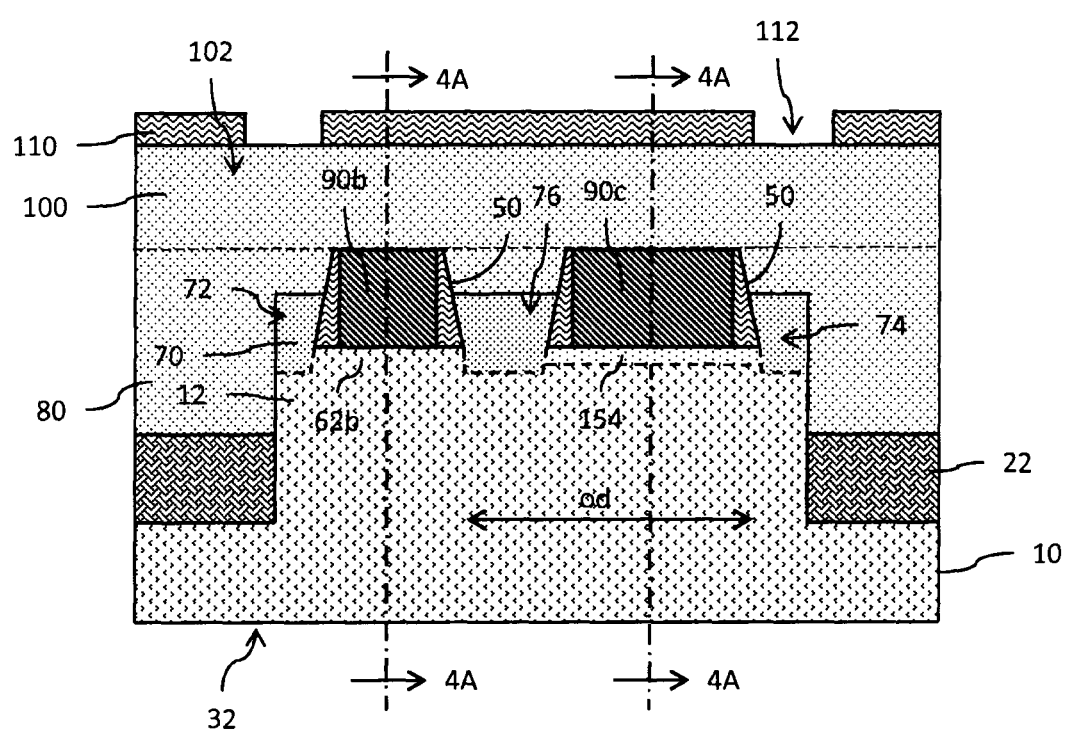

A hard mask layer 110, for example an organic planarization layer (OPL), having a thickness of 100-500 nm is then deposited on the planar top surface of the PMD layer 102 using a coating process. The layer 110 is lithographically patterned in a manner well known to those skilled in the art to form openings 112 at desired locations for making electrical contact to the source and drain regions 72 and 74, respectively. With respect to the region 30, as shown in FIG. 19A, the openings 112 are aligned at positions adjacent the sidewall spacers 50 on opposite sides of the metal gate structure 90a. With respect to the region 32, as shown in FIG. 19B, the opening for the source region 72 is aligned at a position adjacent the sidewall spacer 50 on the source side of the metal gate structure 90b, while the opening for the drain region 74 is aligned at a position adjacent the sidewall spacer 50 on the drain side of the metal gate structure 90c.

It will be noted that the opening 112 for the contact to the drain region 74 is offset by an offset distance "od" from the sidewall spacer 50 on the drain side of the metal gate structure 90b. In an example, for a transistor with a channel region 62b having a channel length of 100-250 nm the offset distance may comprise 1-10 μm. It is further noted that no opening is provided to make contact to the region 76. In this configuration, the channel regions 62b and 62c are coupled in series with each other through region 76, with the metal gate structure 90b associated with a main transistor and metal gate structure 90c associated with an auxiliary transistor whose source-drain paths are coupled in series.

Figure 20A:
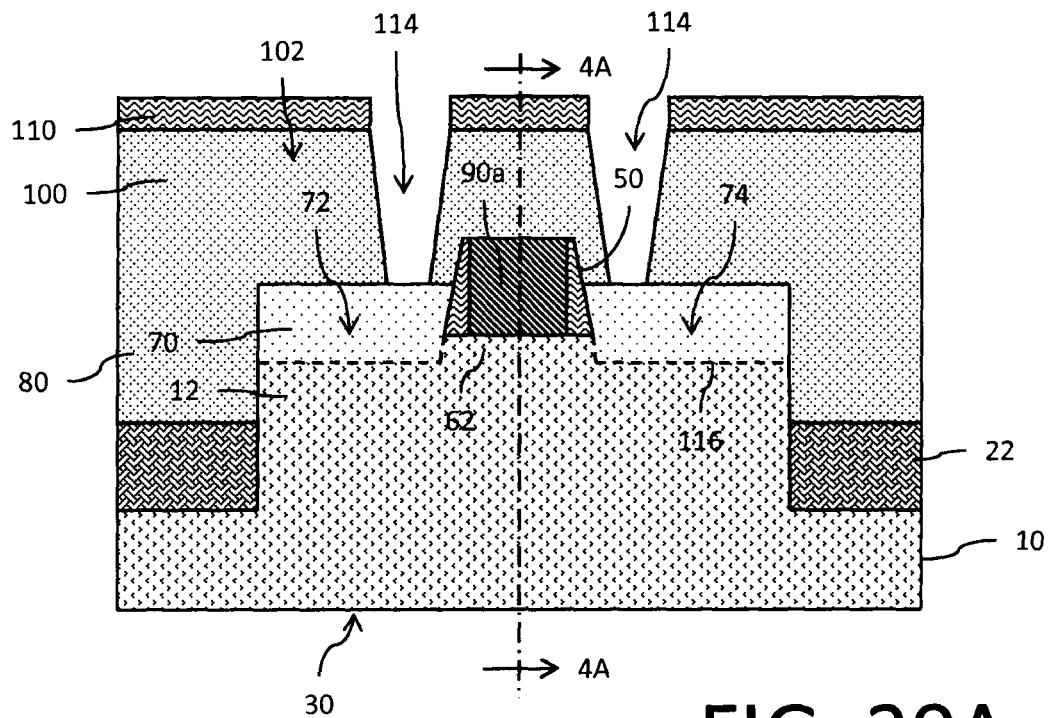
Figure 20B:
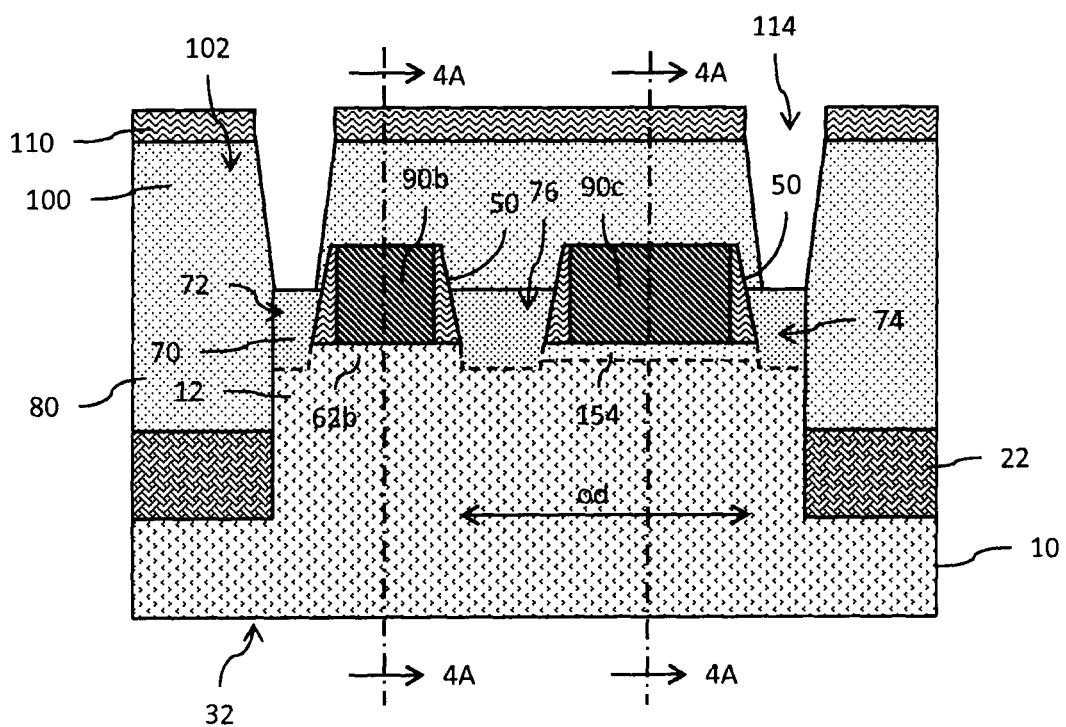

A reactive ion etch (RIE) is then performed to open and extend apertures 114 completely through the pre-metallization dielectric (PMD) 102 (materials 80 and 100) to expose a top surface of (and perhaps penetrate slightly into) the heavily doped epitaxial growth 70. The result is shown in FIGS. 20A-20B.

The mask layer 110 is then removed.

Figure 21A:
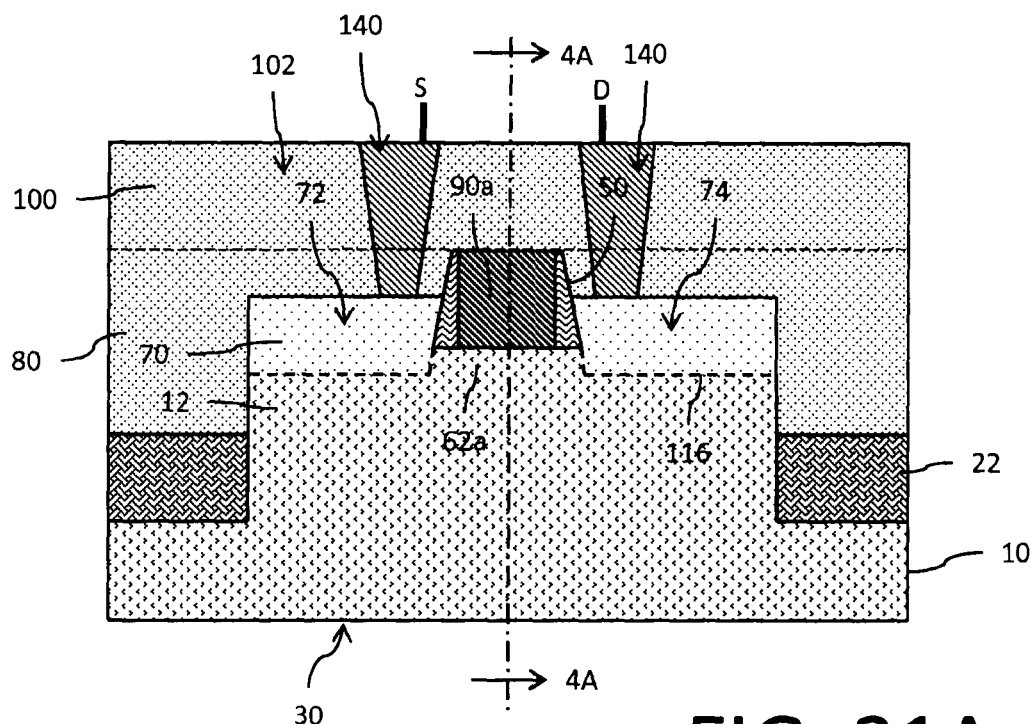
Figure 21B:
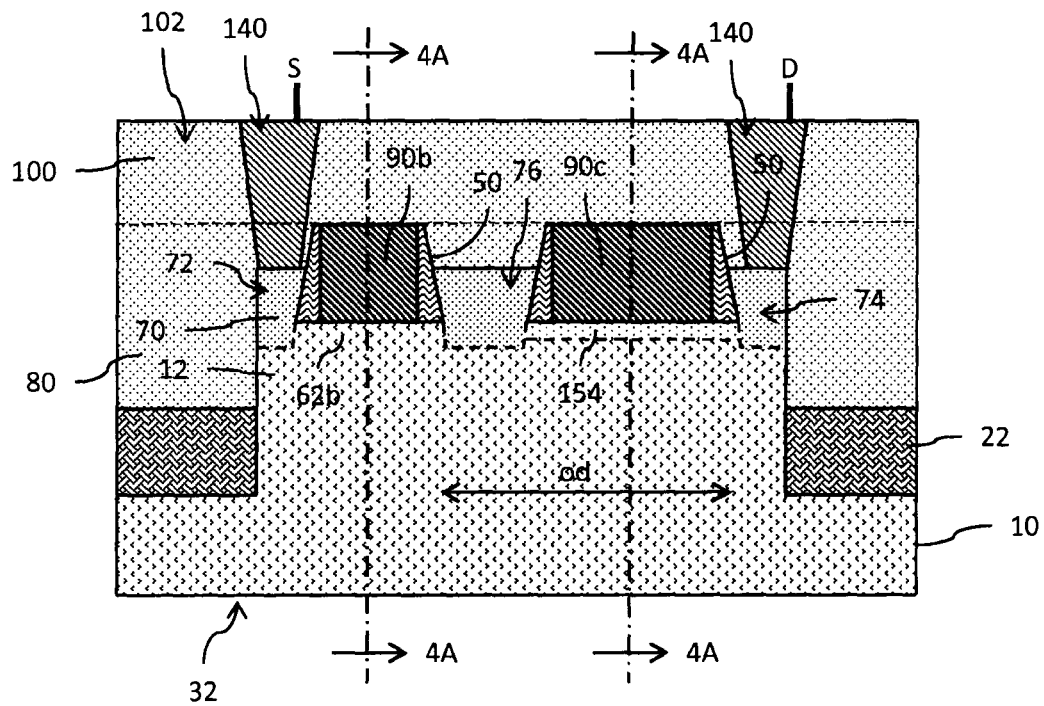

Reference is now made to FIGS. 21A-21B. The apertures 114 are then filled with metal material(s) to define a contact 140 made to the source and drain regions of the transistor. As necessary, a conventional chemical-mechanical planarization (CMP) technique may be used to remove excess metal so as to provide a planar top surface. The metal materials defining the contact 140 may, for example, comprise tungsten deposited using a chemical vapor deposition process.

The fabrication process is compatible with the formation of a silicide at the bottom of the contact 140. The techniques for salicidation are well known to those skilled in the art. The silicide may, for example, comprise a typical nickel platinum silicide or alternatively a silicide arising from the use of a titanium nitride liner for the contact 140.

Figure 22A:
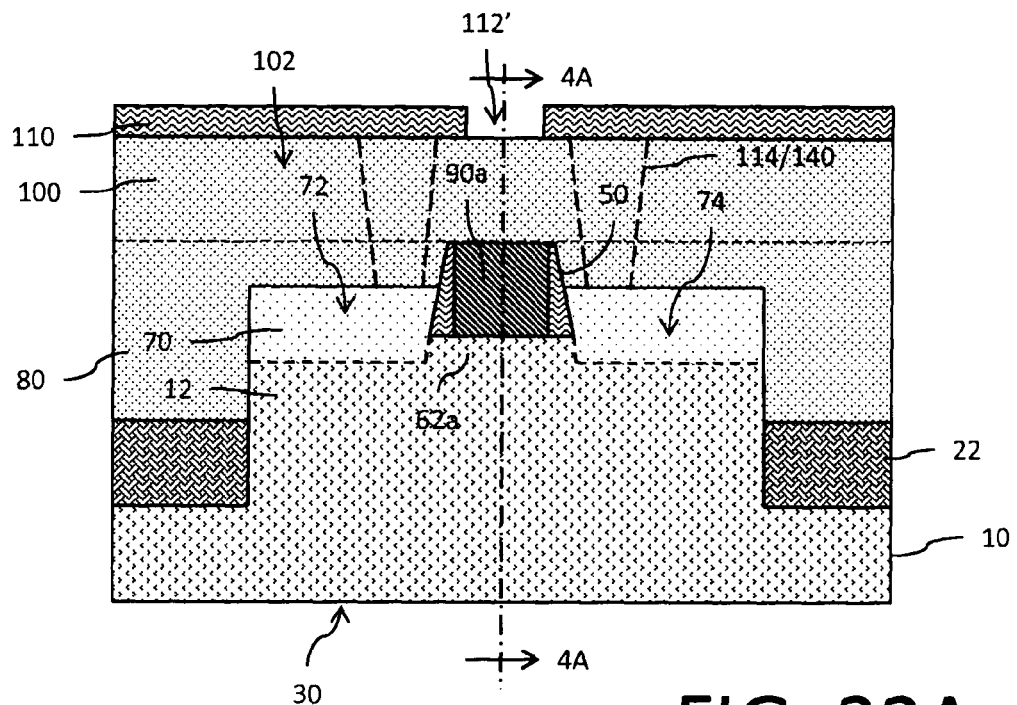
Figure 22B:
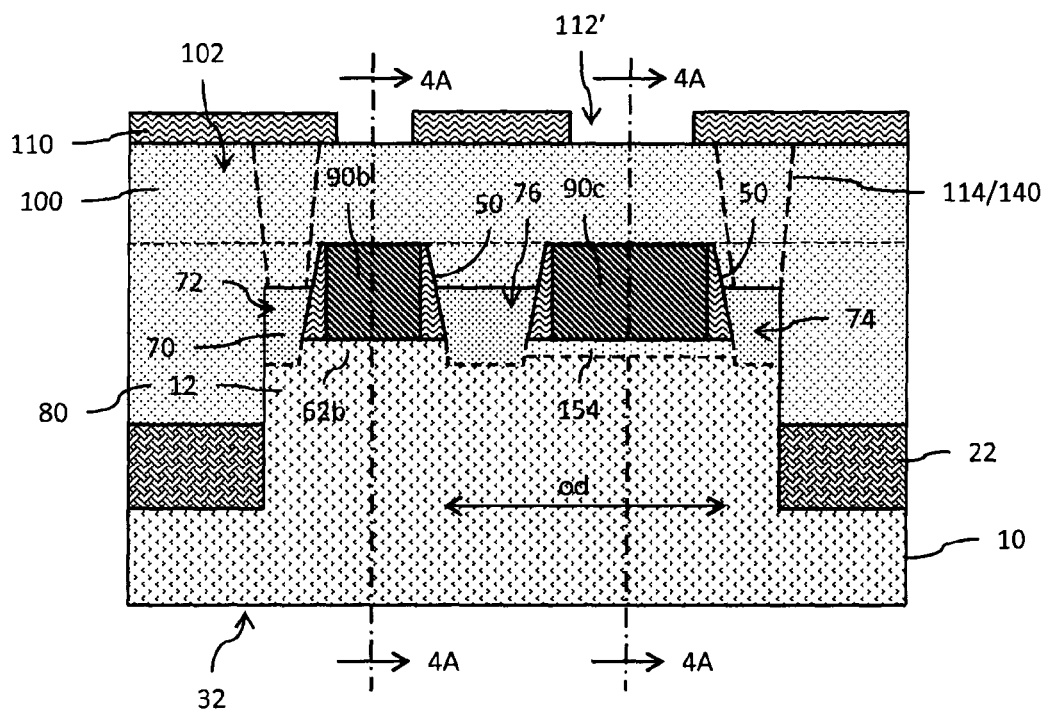

The hard mask layer deposited on the planar top surface of the PMD layer 102 may also be lithographically patterned in a manner well known to those skilled in the art to form openings 112' at desired locations for making electrical contact to the gate regions. This is shown in FIGS. 22A-22B. It is noted that the openings 112' shown in FIGS. 22A-22B may be formed in a different plane than the openings 112 shown in FIGS. 19A-19B, or if space allows may be formed in the same plane. This is indicated by the dotted lines for the source/drain contacts.

Figure 23A:
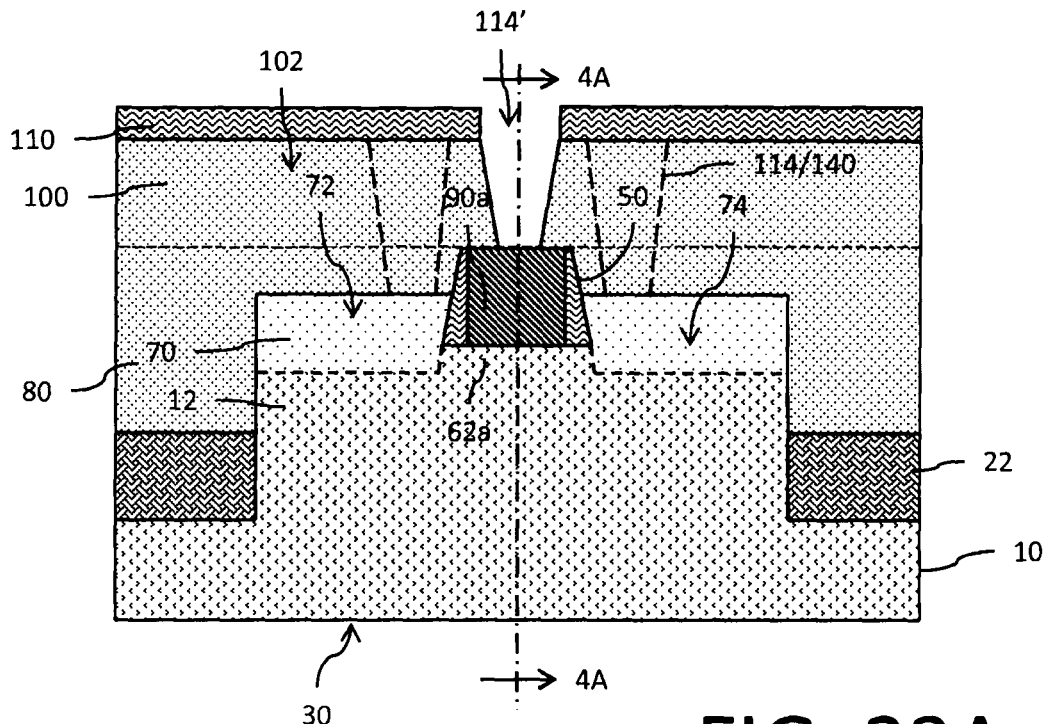
Figure 23B:
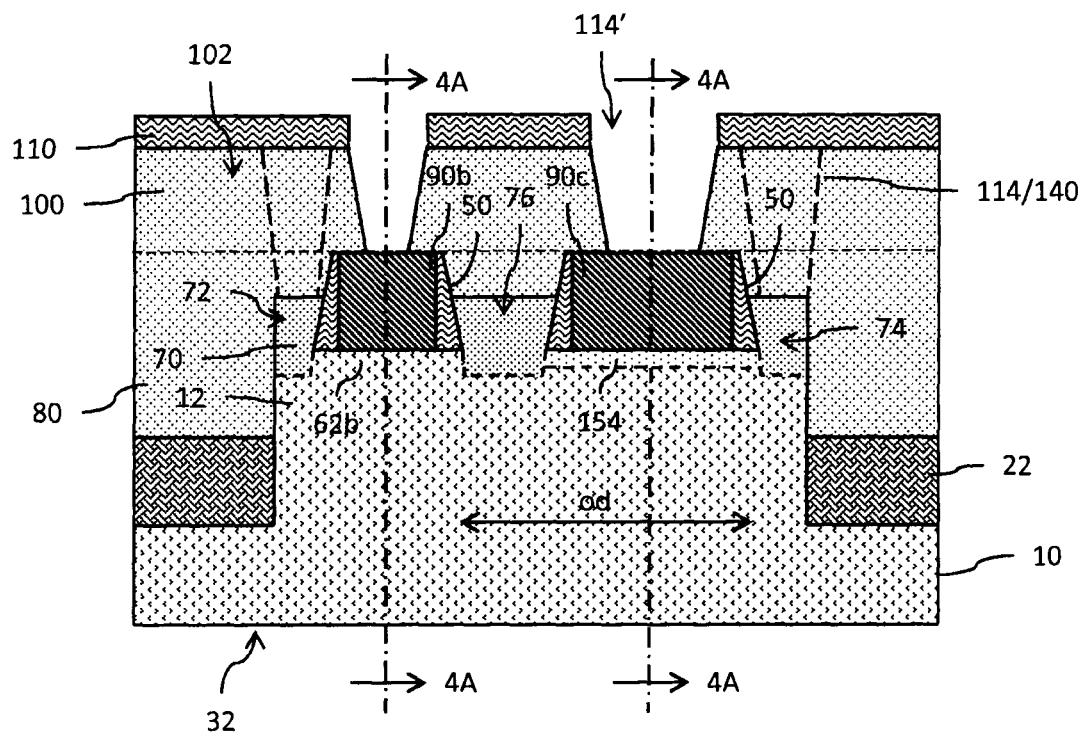

A reactive ion etch (RIE) is then performed to open and extend apertures 114' completely through the pre-metallization dielectric (PMD) 102 (material 100) to reach an upper conductive surface of the metal gate structure 90. The result is shown in FIGS. 23A-23B. It will be understood that the etching operations of FIGS. 20A-20B and 23A-23B may occur simultaneously.

Figure 24A:
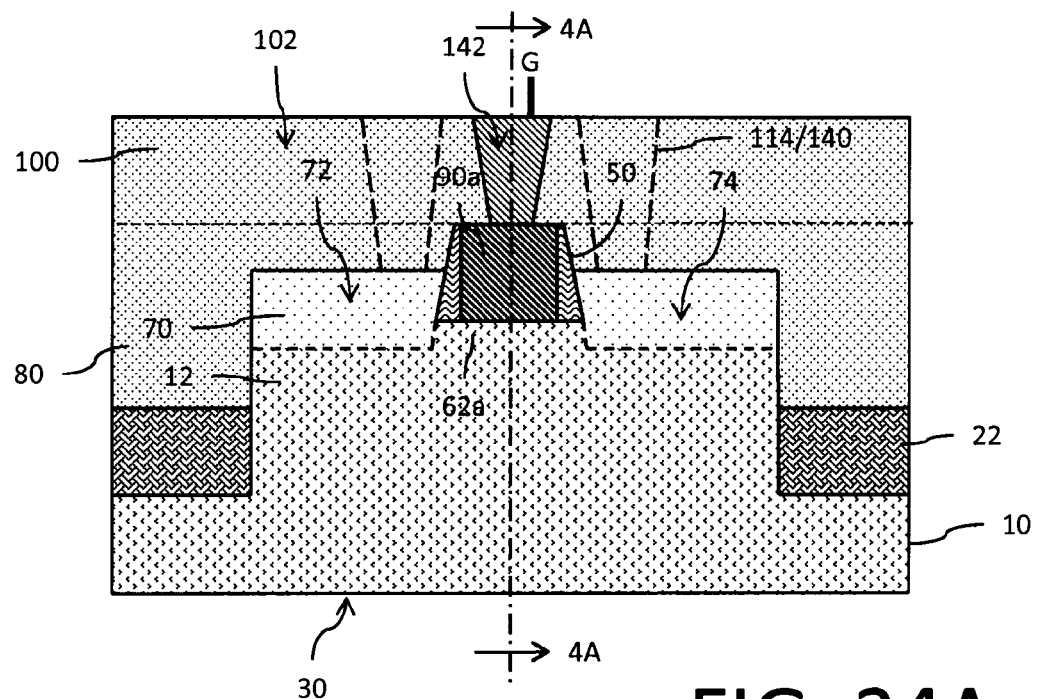
Figure 24B:
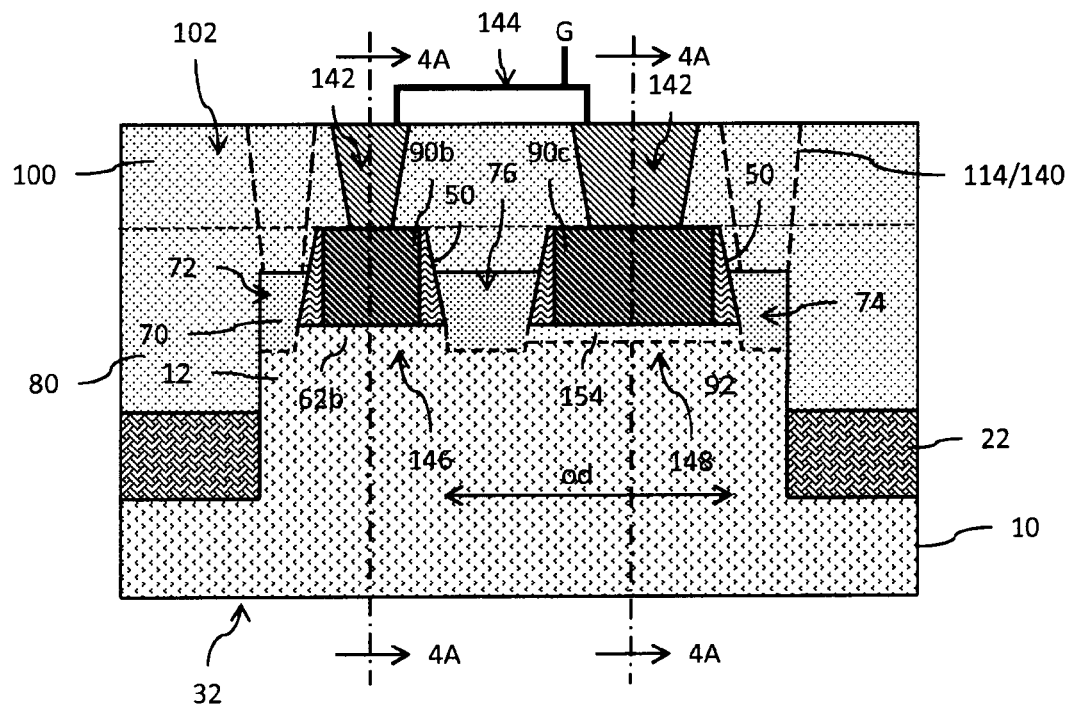

The apertures 114' are then filled with metal material(s) to define a contact 142 made to the metal gate structures 90 of the transistor. The result is shown in FIGS. 24A-24B. It will be understood that the filling operations of FIGS. 21A-21B and 24A-24B may occur simultaneously. As necessary, a conventional chemical-mechanical planarization (CMP) technique may be used to remove excess metal so as to provide a planar top surface. The metal materials defining the contact 142 may, for example, comprise tungsten deposited using a chemical vapor deposition process.

With specific reference to FIG. 24A and the transistors of the region 30, the contacts 140 for the source and drain regions (72, 74) are immediately adjacent the channel region 62a. For the transistors of region 32 as illustrated in FIG. 24B, however, the contact 140 for the source region 72 is immediately adjacent the channel region 62b, but the contact 140 for the drain region 74 is immediately adjacent the channel region 154 and offset by the offset distance "od" from the channel region 62b with the intervening epitaxial region 76 and channel region 154 defining the laterally diffused metal oxide semiconductor (LDMOS) configuration. When a control voltage is applied to both the metal gate structures 90b and 90c (see, short circuit connection 144), the applied voltage may be selected to cause a main transistor 146 associated with metal gate structure 90b to operate in the saturation region of operation while an auxiliary transistor 148 associated with metal gate structure 90c operates in the linear region of operation (due to the lightly doped channel region 154). In this configuration, the intervening epitaxial region 76 and channel region 154 provides a high resistivity drain extension that is useful in transistors operating at higher voltages.

At this point, front end of line (FEOL) fabrication of the integrated circuit is complete. Further back end of line (BEOL) processing to fabricate metallizations and interconnects may then be performed as well known to those skilled in the art. Included within this BEOL process is the fabrication of the short circuit connection 144. Alternatively, the short circuit connection 144 may be fabricated within the pre-metallization dielectric (PMD) 102.

Although making and using various embodiments are discussed in detail herein, it should be appreciated that as described herein are provided many inventive concepts that may be embodied in a wide variety of contexts. Embodiments discussed herein are merely representative and do not limit the scope of the invention.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated FinFET transistor circuit, comprising:
a fin of semiconductor material supporting a first transistor and a second transistor;
a first transistor gate electrode extending over a first channel region of said fin;
a second transistor gate electrode extending over a second channel region of said fin;
a raised source region of epitaxial growth material extending from a top of said fin on a first side of the first transistor gate electrode;
a raised intermediate region of said epitaxial growth material extending from a top of said fin between a second side of the first transistor gate electrode and a first side of the second transistor gate electrode;
a raised drain region of said epitaxial growth material extending from a top of said fin on a second side of the second transistor gate electrode;
wherein the first and second transistor gate electrodes are short circuit connected to each other; and
wherein said first transistor is configured to have a first threshold voltage and said second transistor is configured to have a second threshold voltage that is different than the first threshold voltage.

2. The circuit of claim 1, further comprising:
a pre-metallization dielectric material covering the raised source region, first and second transistor gate electrodes and raised drain region;
a source contact opening extending through the pre-metallization dielectric material to said raised source region;
a drain contact opening extending through the pre-metallization dielectric material to said raised drain region; and
metal material filling said source and drain contact openings to form source and drain contacts, respectively, with the raised source and drain regions.

3. The circuit of claim 1, further including a substrate supporting said fin, wherein the substrate is one of a silicon on insulator (SOI) substrate and a bulk substrate.

4. The circuit of claim 1, wherein the fin further comprises:
a first recess region at the top of the fin adjacent the first channel region at the first side of the first transistor gate electrode; and
a second recess region at the top of the fin adjacent the second channel region at the second side of the second transistor gate electrode.

5. The circuit of claim 4, wherein the raised source region of said epitaxial growth material fills said first recess region, and wherein the raised drain region of said epitaxial growth material fills said second recess region.

6. The circuit of claim 1, wherein the raised drain region of said second transistor is offset from the second side of the first transistor gate electrode by an offset distance to provide a laterally diffused metal oxide semiconductor (LDMOS) configuration using said raised intermediate region and said second channel region.

7. The circuit of claim 1, wherein the second threshold voltage is greater than the first threshold voltage.

8. The circuit of claim 1, wherein the second channel region is longer than the first channel region.

9. The circuit of claim 1, wherein the epitaxial growth material is doped to a first doping concentration and wherein said second channel region is doped to a second doping concentration lighter than the first doping concentration.

10. The circuit of claim 1, wherein the first and second transistor gate electrodes are configured to set the first and second threshold voltages, respectively.

11. The circuit of claim 10, wherein the second transistor gate electrode includes a dipole layer which configures the second threshold voltage to differ from the first threshold voltage.

12. A method for manufacturing a FinFET transistor, comprising:
- forming a fin of semiconductor material;
- forming a first transistor gate structure for a first transistor that extends over a first channel region of said fin;
- forming a second transistor gate structure for a second transistor that extends over a second channel region of said fin;
- epitaxially growing epitaxial growth material on a top of said fin on a first side of the first transistor gate structure to form a raised source region, between a second side of the first transistor gate structure and a first side of the second transistor gate structure to form a raised intermediate region, and on a second side of the second transistor gate structure to form a raised drain region;
- short circuit connecting the first and second transistor gate structures to each other; and
- configuring said first transistor to have a first threshold voltage and said second transistor to have a second threshold voltage that is different than the first threshold voltage.

13. The method of claim 12, further comprising:
- depositing a pre-metallization dielectric material to cover the raised source region, first and second transistor gate electrodes and raised drain region;
- extending a source contact opening through the pre-metallization dielectric material to said raised source region;
- extending a drain contact opening through the pre-metallization dielectric material to said raised drain region; and
- filling the source and drain contact openings with metal to form source and drain contacts, respectively, with the raised source and drain regions.

14. The method of claim 12, wherein the epitaxial growth material is doped with a first concentration and wherein said second channel region is doped with a second concentration, said second concentration being lighter than said first concentration.

15. The method of claim 12, wherein forming the first and second transistor gate structures comprises:
- forming dummy gate structures;
- removing the dummy gate structures after deposition of a pre-metallization dielectric material; and
- replacing the removed dummy gate structures with metal gate electrodes.

16. The method of claim 15, further comprising providing different metal gate electrode structures for the first and second transistor gate structures to configure said first transistor to have the first threshold voltage and said second transistor to have the second threshold voltage.

17. The method of claim 16, further comprising providing a dipole layer in the second transistor gate structure.

18. The method of claim 12, wherein forming the fin further comprises:
- forming a first recess region at the top of the fin adjacent the first channel region at the first side of the first transistor gate electrode; and
- forming a second recess region at the top of the fin adjacent the second channel region at the second side of the second transistor gate electrode.

19. The method of claim 18, wherein epitaxially growing epitaxial growth material comprises filling said first and second recess regions with epitaxial growth material.

20. The method of claim 12, further comprising offsetting the raised drain region from the second side of the first transistor gate electrode by an offset distance to provide a laterally diffused metal oxide semiconductor (LDMOS) configuration using said raised intermediate region and the second channel region.

21. The method of claim 12, further comprising:
- in situ doping the epitaxial growth material to a first concentration; and
- implant doping the second channel region to a second concentration, wherein the second concentration is lighter than the first concentration.

22. An integrated circuit, comprising:
- a substrate;
- a first FinFET transistor supported by said substrate and including a first fin of semiconductor material; and
- a second FinFET transistor support by said substrate and including a second fin of semiconductor material;
- wherein the first FinFET transistor comprises:
  - a first transistor gate electrode extending over a first channel region of said first fin;
  - a first raised source region of epitaxial growth material extending from a top of said first fin on a first side of the first transistor gate electrode;
  - a raised drain region of said epitaxial growth material extending from a top of said first fin on a second side of the first transistor gate electrode;
- wherein the second FinFET transistor comprises:
  - a main transistor gate electrode extending over a first channel region of said second fin to form a main transistor;
  - an auxiliary transistor gate electrode extending over a second channel region of said second fin to form an auxiliary transistor;
  - a raised source region of said epitaxial growth material extending from a top of said second fin on a first side of the main transistor gate electrode;
  - a raised intermediate region of said epitaxial growth material extending from a top of said second fin between a second side of the main transistor gate electrode and a first side of the auxiliary transistor gate electrode; and
  - a raised drain region of said epitaxial growth material extending from a top of said second fin on a second side of the auxiliary transistor gate electrode;
- wherein the main and auxiliary transistor gate electrodes are short circuit connected to each other; and
- wherein said main transistor is configured to have a first threshold voltage and said auxiliary transistor is configured to have a second threshold voltage that is different than the first threshold voltage.

23. The circuit of claim 22, wherein the substrate is one of a silicon on insulator (SOI) substrate and a bulk substrate.

24. The circuit of claim 22, wherein the first FinFET transistor is a device within a CMOS logic circuit and wherein the second FinFET transistor is a transistor having a laterally diffused metal oxide semiconductor (LDMOS) configuration.

25. The circuit of claim 22, further comprising:
- a pre-metallization dielectric material covering the raised source regions, first, main and auxiliary transistor gate electrodes and raised drain regions;
- a source contact opening extending through the pre-metallization dielectric material to each raised source region;
- a drain contact opening extending through the pre-metallization dielectric material to each raised drain region; and
- metal material filling said source and drain contact openings to form source and drain contacts, respectively, with each of the raised source and drain regions.

26. The circuit of claim 22, wherein the raised drain region of said auxiliary transistor is offset from the second side of the main transistor gate electrode by an offset distance to provide a laterally diffused metal oxide semiconductor (LDMOS) configuration using said raised intermediate region and second channel region of said second fin.

27. The circuit of claim 22, wherein the epitaxial growth material is doped with a first concentration and wherein said second channel region is doped with a second concentration, said second concentration being lighter than said first concentration.

28. The circuit of claim 22, wherein said auxiliary transistor gate electrode includes a dipole layer configuring the second threshold voltage to be different than the first threshold voltage.

29. The circuit of claim 22,
wherein the first fin comprises:
   a first recess region at the top of the first fin on a first side of the first channel region of the first fin; and
   a second recess region at the top of the first fin on a second side of the first channel region of the first fin; and
wherein the second fin comprises
   a first recess region at the top of the second fin on a first side of the first channel region of the second fin; and
   a second recess region at the top of the second fin on a second side of the second channel region of the second fin.

30. The circuit of claim 29, wherein the epitaxial growth material fills said first and second recess regions.

* * * * *